(12) United States Patent
Yamaguchi et al.

(10) Patent No.: US 11,514,970 B2
(45) Date of Patent: Nov. 29, 2022

(54) MEMORY DEVICE AND METHOD HAVING A CONTROL CIRCUIT CONFIGURED TO ACQUIRE INFORMATION ON A STATE OF A CONTROL TARGET, CAUSES THE CONTROL TARGET TO EXECUTE A READ AND WRITE OPERATION BASED ON THE STATE

(71) Applicant: Kioxia Corporation, Tokyo (JP)

(72) Inventors: Marina Yamaguchi, Yokohama Kanagawa (JP); Kensuke Ota, Yokohama Kanagawa (JP); Kazuhiko Yamamoto, Fujisawa Kanagawa (JP); Masumi Saitoh, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/470,802

(22) Filed: Sep. 9, 2021

(65) Prior Publication Data

US 2022/0262422 A1 Aug. 18, 2022

(30) Foreign Application Priority Data

Feb. 17, 2021 (JP) .............................. JP2021-023376

(51) Int. Cl.
*G11C 11/22* (2006.01)
(52) U.S. Cl.
CPC ...... *G11C 11/2273* (2013.01); *G11C 11/2275* (2013.01); *G11C 11/2277* (2013.01)
(58) Field of Classification Search
CPC ............ G11C 11/2275; G11C 11/2277; G11C 11/2273

USPC ....................................... 365/189.01, 189.04
See application file for complete search history.

(56) References Cited

U.S. PATENT DOCUMENTS

| 5,287,533 | A | 2/1994 | Kamiya |
| 5,696,883 | A | 12/1997 | Arima |
| 8,275,727 | B2 | 9/2012 | Elmegreen et al. |
| 9,659,249 | B1 | 5/2017 | Copel |
| 10,164,179 | B2 | 12/2018 | Brew et al. |
| 10,248,907 | B2 | 4/2019 | Gokmen et al. |
| 10,482,025 | B2 | 11/2019 | Oikawa |
| 11,093,173 | B2 * | 8/2021 | Yamaki ................. G11C 16/26 |
| 11,282,559 | B1 * | 3/2022 | Tanaka ............. H01L 27/11597 |

(Continued)

FOREIGN PATENT DOCUMENTS

| JP | H03-204068 A | 9/1991 |
| JP | 2540654 B2 | 10/1996 |

(Continued)

*Primary Examiner* — Connie C Yoha
(74) *Attorney, Agent, or Firm* — Foley & Lardner LLP

(57) ABSTRACT

A memory device according to an embodiment includes first and second interconnects, memory cells, and a control circuit. In a first process, the control circuit applies a write voltage of a first direction to a memory cell coupled to selected first and second interconnects, and applies a write voltage of a second direction to a memory cell coupled to the selected first interconnect and a non-selected second interconnect. In second processes of first to m-th trial processes, the control circuit applies the write voltage of the second direction to the memory cell coupled to the selected first and second interconnects, and omits a write operation in which the memory cell coupled to the selected first interconnect and the non-selected second interconnect is targeted.

20 Claims, 21 Drawing Sheets

(56) References Cited

U.S. PATENT DOCUMENTS

| | | | |
|---|---|---|---|
| 2006/0085614 A1* | 4/2006 | Sakai | G06F 3/0611 |
| | | | 711/171 |
| 2019/0147330 A1 | 5/2019 | Otsuka et al. | |
| 2020/0005129 A1 | 1/2020 | Chan et al. | |
| 2020/0005130 A1 | 1/2020 | Nishi et al. | |
| 2020/0111008 A1 | 4/2020 | Kataeva | |
| 2020/0125936 A1 | 4/2020 | Kataeva et al. | |

FOREIGN PATENT DOCUMENTS

| | | |
|---|---|---|
| JP | 2012-059321 A | 3/2012 |
| JP | 2018-160060 A | 10/2018 |
| JP | 6481667 B2 | 3/2019 |
| JP | 2020-004313 A | 1/2020 |
| JP | 2020-068048 A | 4/2020 |
| JP | 6724870 B2 | 7/2020 |
| WO | WO-2019/239245 A1 | 12/2019 |

* cited by examiner

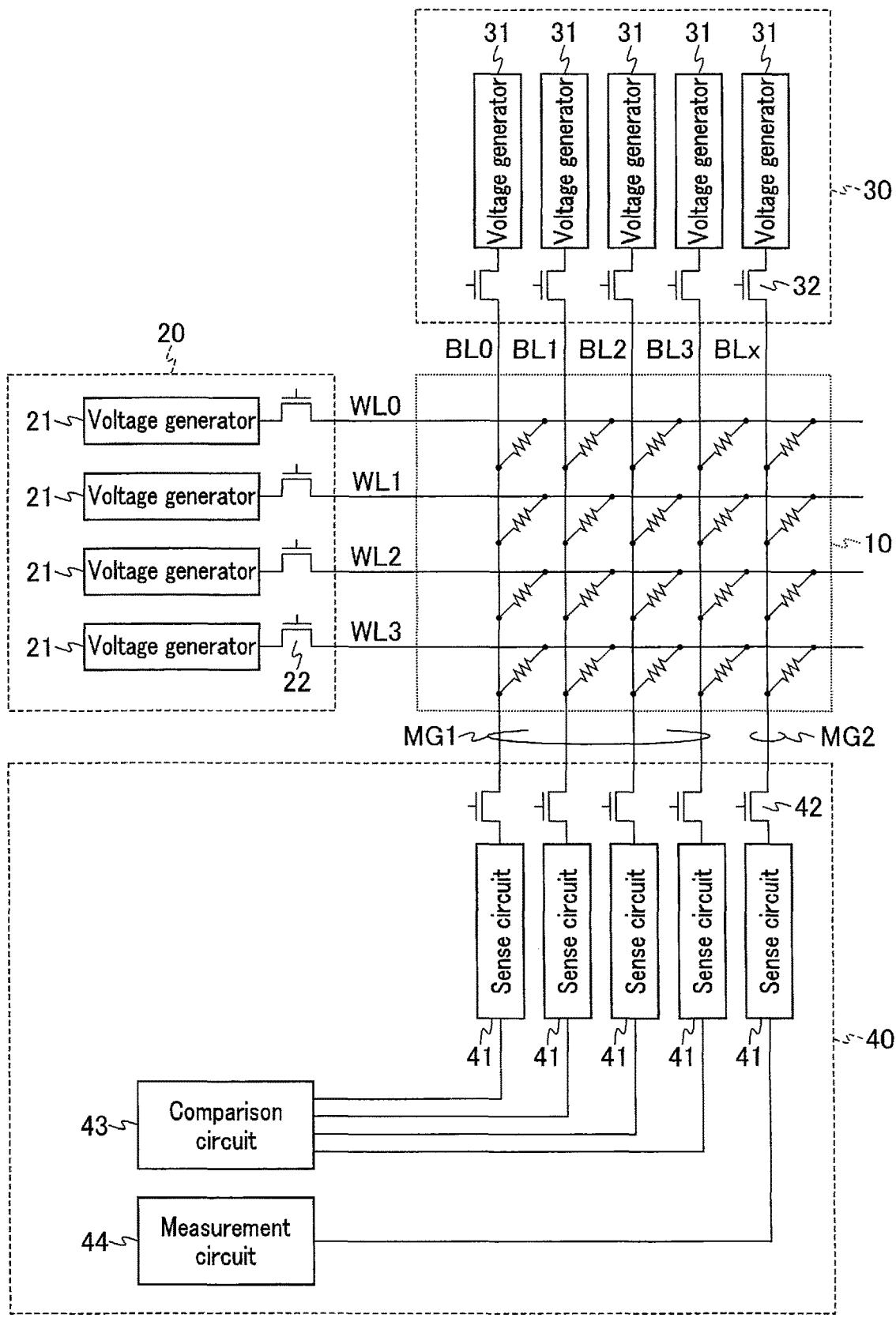
F I G. 5

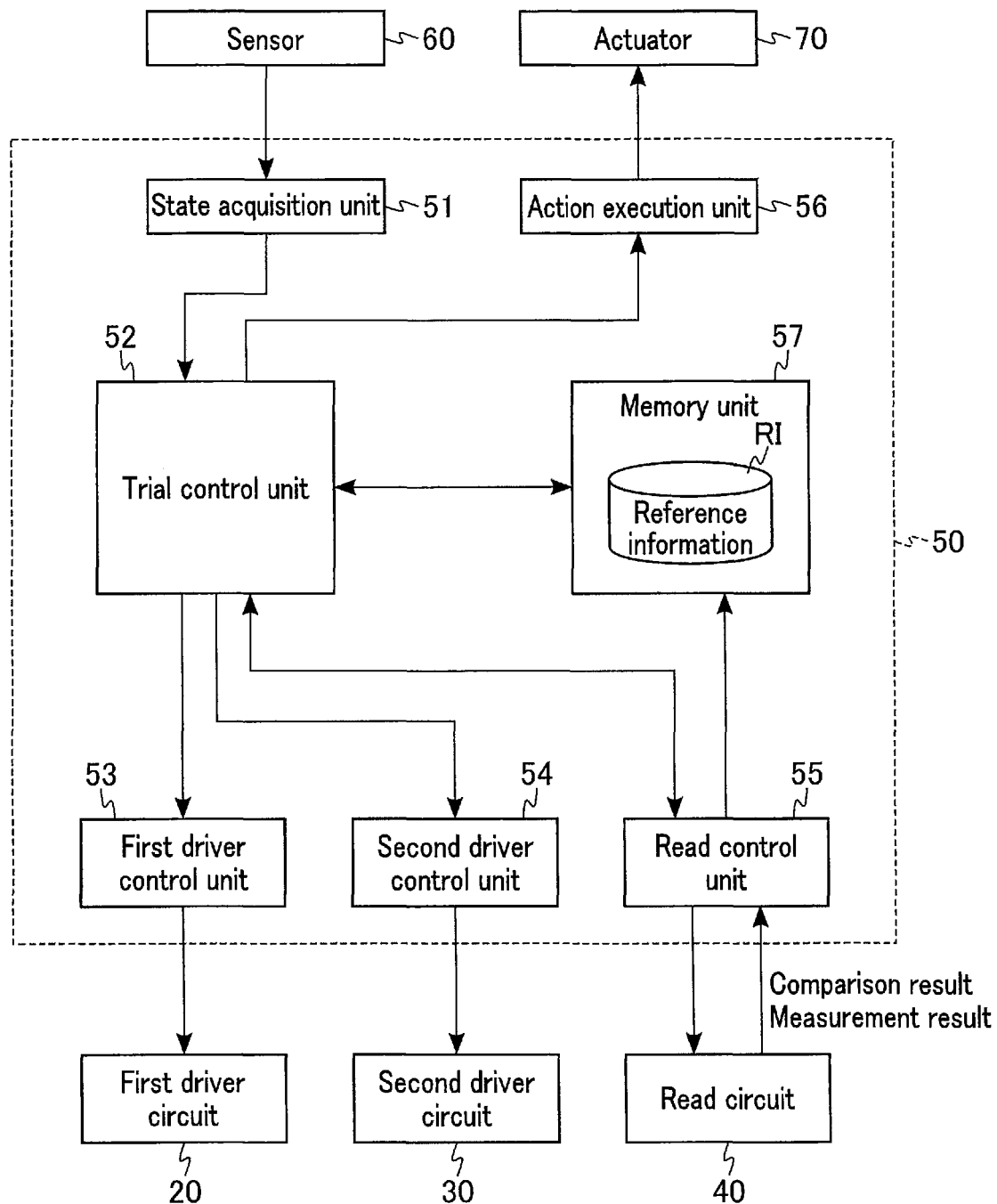
F I G. 6

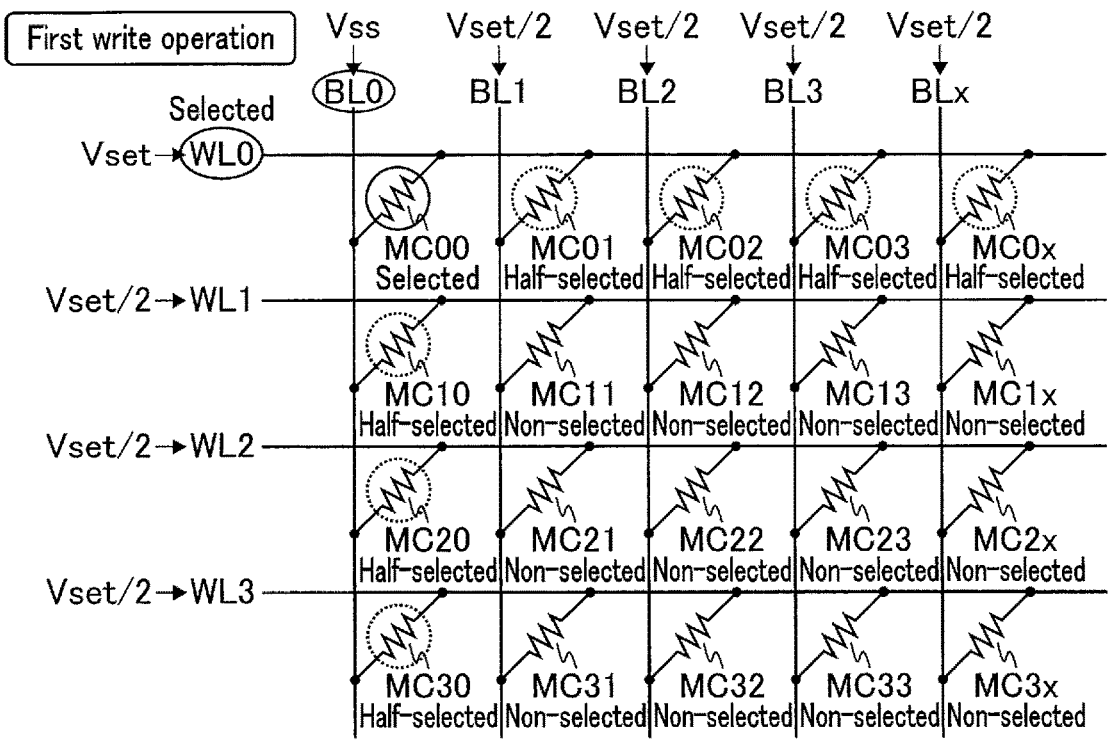
F I G. 9
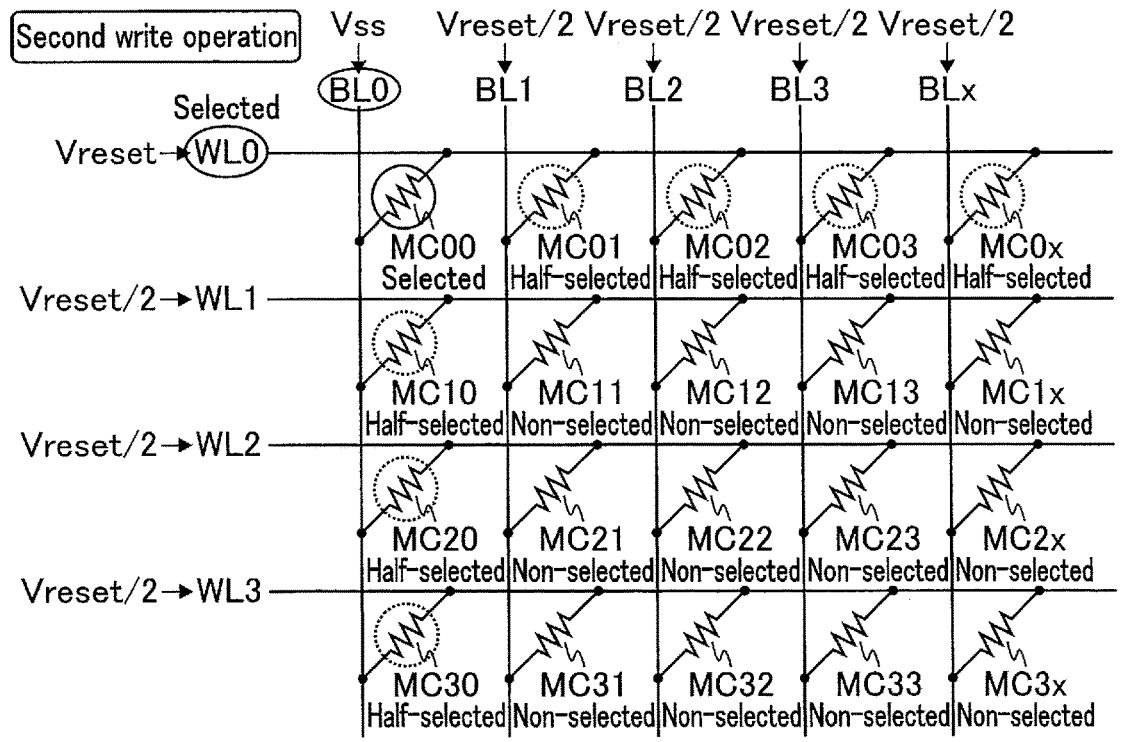
F I G. 10

| | Attribute | First trial process | |
|---|---|---|---|
| | | Penalty process | Reward process |
| MC00 | Selected | Vreset → time | Vset → time |
| MC01 | Non-selected | ✕ | Vreset → time |
| MC02 | Non-selected | ✕ | Vreset → time |
| MC03 | Non-selected | ✕ | Vreset → time |
| MC0x | Reference | Vreset → time | Vset → time |

FIG. 15

| | Attribute | Second trial process | |
|---|---|---|---|
| | | Penalty process | Reward process |
| MC00 | Selected | Vreset → time | Vset → time |
| MC01 | Non-selected | Vset → time | Vreset → time |
| MC02 | Non-selected | Vset → time | Vreset → time |
| MC03 | Non-selected | Vset → time | Vreset → time |
| MC0x | Reference | Vreset → time | Vset → time |

FIG. 16

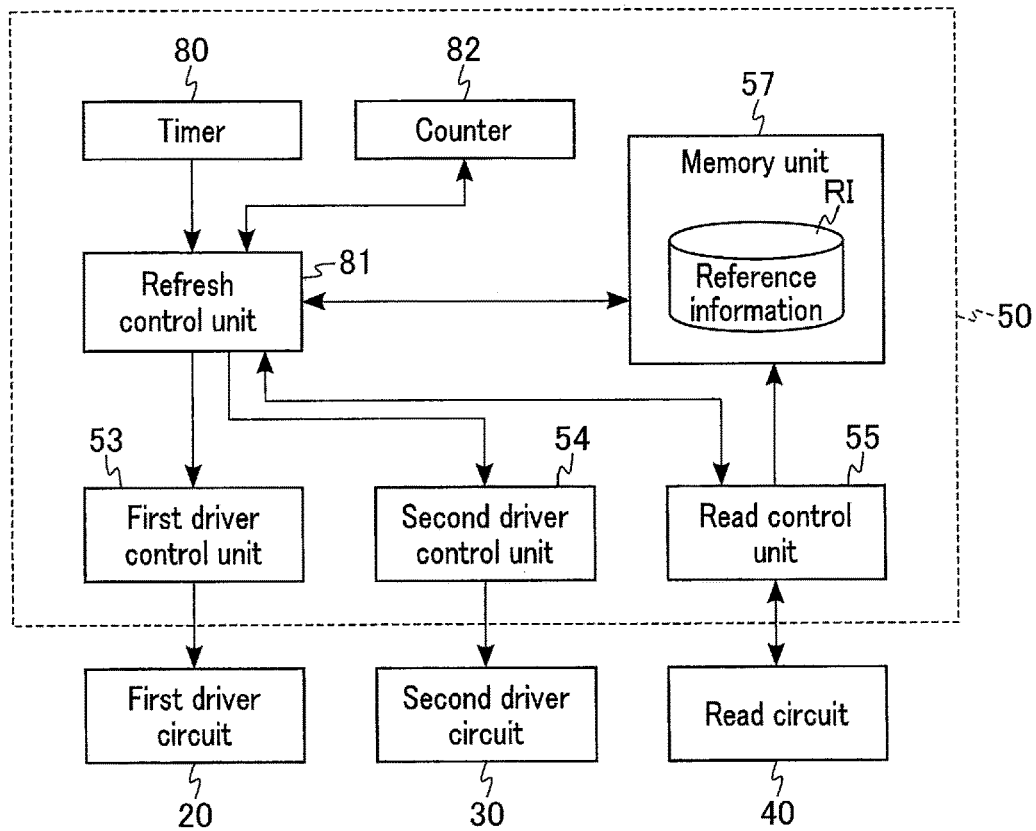
F I G. 23
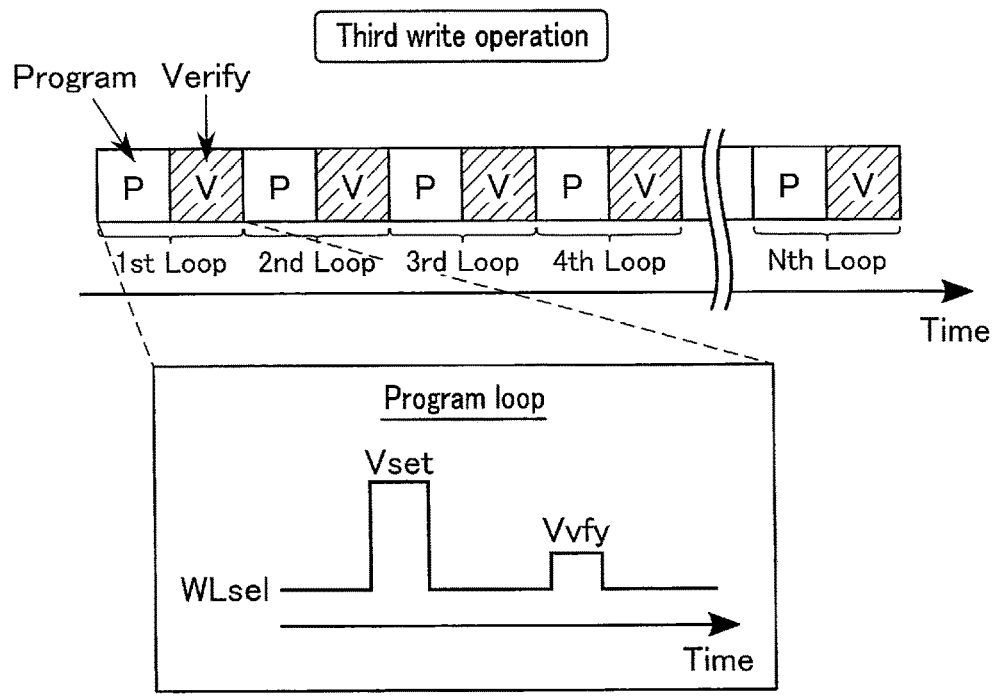
F I G. 24

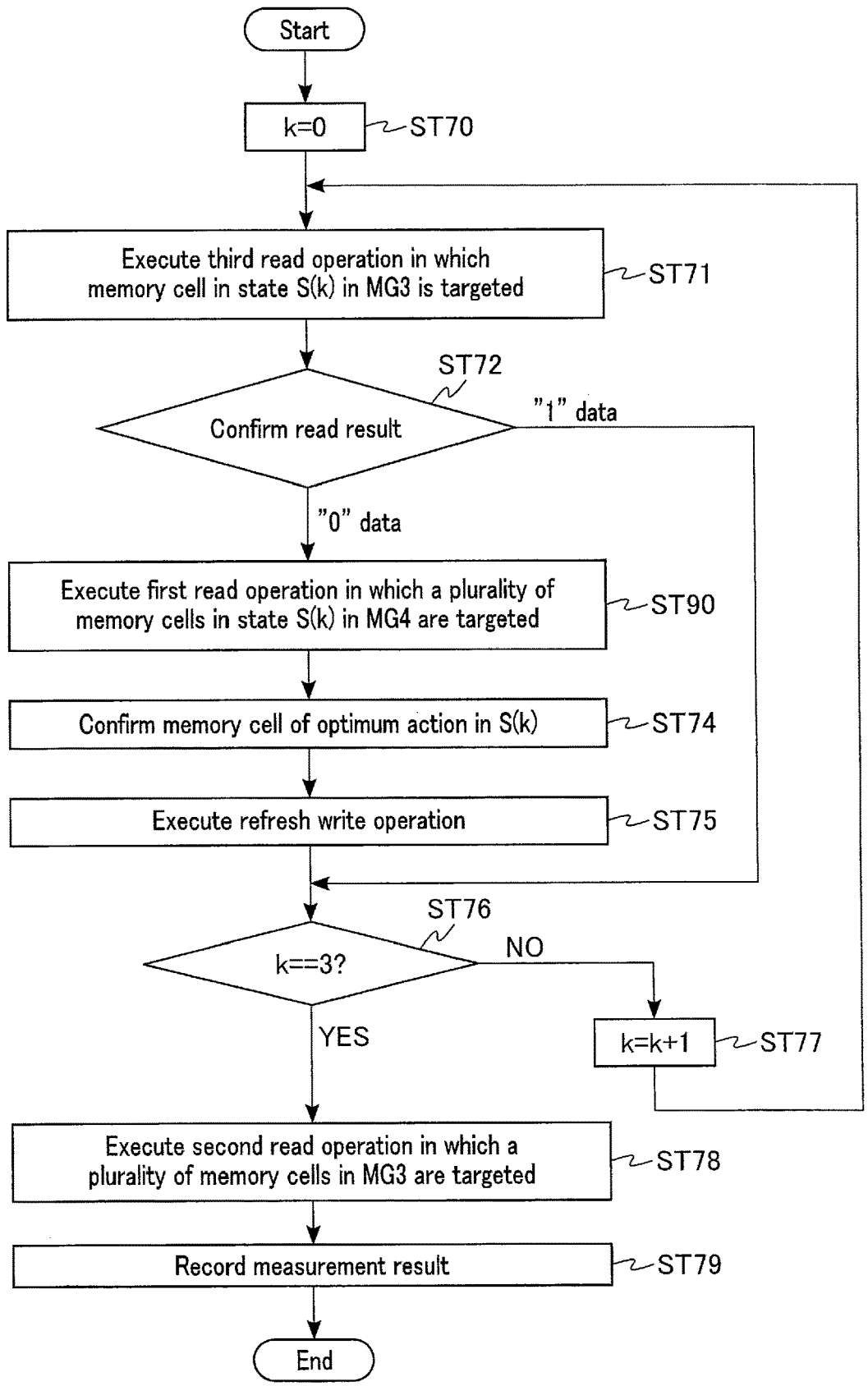
F I G. 31

US 11,514,970 B2

MEMORY DEVICE AND METHOD HAVING A CONTROL CIRCUIT CONFIGURED TO ACQUIRE INFORMATION ON A STATE OF A CONTROL TARGET, CAUSES THE CONTROL TARGET TO EXECUTE A READ AND WRITE OPERATION BASED ON THE STATE

CROSS-REFERENCE TO RELATED APPLICATIONS

This application is based upon and claims the benefit of priority from Japanese Patent Application No. 2021-023376, filed Feb. 17, 2021, the entire contents of which are incorporated herein by reference.

FIELD

Embodiments described herein relate generally to a memory device and a memory method.

BACKGROUND

There is known a memory device having a cross-point memory cell array capable of storing data in a nonvolatile manner.

BRIEF DESCRIPTION OF THE DRAWINGS

FIG. 5 is a circuit diagram illustrating an example of a circuit configuration of the memory cell array provided in the memory device of the first embodiment;

FIG. 6 is a block diagram illustrating an example of the functional configuration of a control circuit provided in the memory device of the first embodiment;

FIG. 9 is a schematic view illustrating an example of how a first write operation is performed in the memory device of the first embodiment;

FIG. 10 is a schematic view illustrating an example of how a second write operation is performed in the memory device of the first embodiment;

FIG. 15 is a table illustrating an example of how a write operation is executed for each of memory cells that are selected in the first trial process performed in the memory device of the first embodiment;

FIG. 16 is a table illustrating an example of how a write operation is executed for each of memory cells that are selected in the second trial process performed in the memory device of the first embodiment;

FIG. 23 is a block diagram illustrating an example of the functional configuration of a control circuit provided in the memory device of the third embodiment;

FIG. 24 is a schematic view illustrating an example of how a third write operation is performed in the memory device of the third embodiment;

FIG. 31 is a flowchart illustrating an example of how a refresh operation is performed in the memory device of the fourth embodiment.

DETAILED DESCRIPTION

Figure 1:
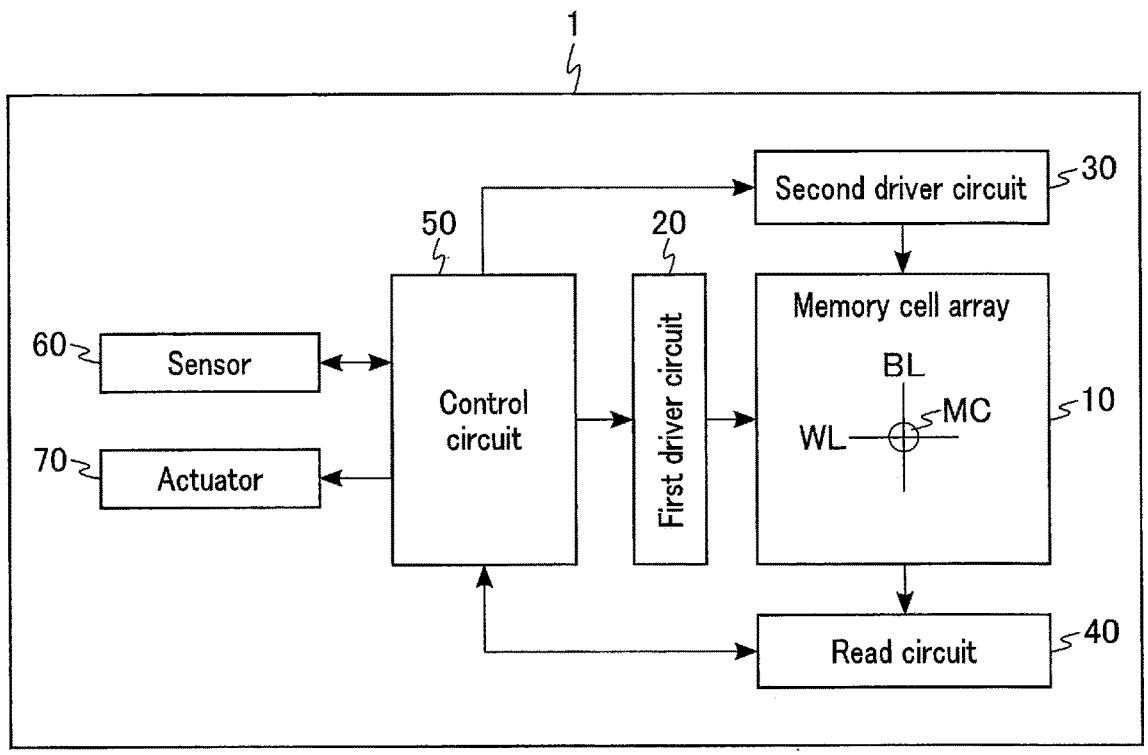
FIG. 1 is a block diagram illustrating an example of a configuration of a memory device according to the first embodiment.

In general, according to one embodiment, a memory device includes a plurality of first interconnects, a plurality of second interconnects, a plurality of first memory cells, and a control circuit. The second interconnects each intersects the first interconnects. The first memory cells are respectively provided at a plurality of intersections between the first interconnects and the second interconnects. Each of the first memory cells is coupled to one first interconnect of the first interconnects and one second interconnect of the second interconnects. The control circuit is configured to acquire information on a state of a control target, causes the control target to execute an action based on the state, and execute a read operation and a write operation, based on the state. The control circuit is configured to execute a plurality of trial processes each including a first operation, a second operation and a third operation. In the first operation, the control circuit executes a first read operation for a plurality of first memory cells coupled between a first interconnect selected from the first interconnects, based on the control target being in a first state, and the second interconnects, and selects a second interconnect, based on magnitudes of read currents of the second interconnects acquired by the first read operation. In the second operation, the control circuit causes the control target to execute an action associated with the selected second interconnect, and the control target transitions to a second state after executing the action associated with the selected second interconnect. In the third operation, the control circuit executes a first process or a second process in which the selected first interconnect is targeted, based on the control target being in the second state. In the first process, the control circuit applies a write voltage of a first direction to a first memory cell coupled to the selected first interconnect and the selected second interconnect, and applies a write voltage of a second direction different from the first direction to a first memory cell coupled to the selected first interconnect and a non-selected second interconnect. In second processes of first to m-th trial processes (m is an integer of 2 or more), the control circuit applies the write voltage of the second direction to the first memory cell coupled to the selected first interconnect and the selected second interconnect, and omits a write operation in which the first memory cell coupled to the selected first interconnect and the non-selected second interconnect is targeted. In second processes of (m+1)th and subsequent trial processes, the control circuit applies the write voltage of the second direction to the first memory cell coupled to the selected first interconnect and the selected second interconnect, and applies the write voltage of the first direction to the first memory cell coupled to the selected first interconnect and the non-selected second interconnect.

Hereinafter, embodiments will be described with reference to the accompanying drawings. The drawings are schematic or conceptual. The dimensions and scales of the drawings are not necessarily the same as those of actual products. In the description below, elements having substantially the same functions and configurations will be denoted by the same reference symbols. The numbers etc. after the letters of reference symbols are referred to by the reference symbols containing the same letters and are used to distinguish between elements having similar configurations. Where elements denoted by reference symbols including the same letters need not be discriminated from each other, they will be denoted by reference symbols including only numerals.

[1] First Embodiment

The memory device 1 according to the first embodiment is a type of memory system that can be used for reinforcement learning. The memory device 1 of the first embodiment will be described below.

[1-1] Configuration

[1-1-1] Overall Configuration of Memory Device 1

FIG. 1 is a block diagram illustrating an example of the configuration of the memory device 1 of the first embodiment. As illustrated in FIG. 1, the memory device 1 includes, for example, a memory cell array 10, a first driver circuit 20, a second driver circuit 30, a read circuit 40, a control circuit 50, a sensor 60 and an actuator 70.

The memory cell array 10 is a set of memory cells MC associated with word lines WL and bit lines BL. The memory cell MC includes a resistance changing element and has a rectifying function. The resistance value of the memory cell MC may change, depending on the write operation or the erase operation. The memory cell MC stores data, based on the resistance value thereof. For example, the memory cell MC stores "1" data when it is in a high resistance state and stores "0" data when it is in a low resistance state. The allocation of data to the resistance value of the memory cell MC may be set in a different way.

The first driver circuit 20 is coupled to a plurality of word lines WL provided in the memory cell array 10. The first driver circuit 20 generates voltages which the memory cell MC uses in the read operation, the write operation, the erase operation, etc. The first driver circuit 20 can apply the generated voltages to each of the plurality of word lines WL.

The second driver circuit 30 is coupled to a plurality of bit lines BL provided in the memory cell array 10. The second driver circuit 30 generates voltages which the memory cell MC uses in the read operation, the write operation, the erase operation, etc. The second driver circuit 30 can apply the generated voltages to each of the plurality of bit lines BL.

The read circuit 40 is coupled to a plurality of bit lines BL provided in the memory cell array 10. The read circuit 40 is used in the read operation. The read circuit 40 can determine what data is stored in the memory cell MC, measure the amount of read current flowing through a bit line BL, compare read results between the plurality of bit lines BL, and the like.

The control circuit 50 controls the overall operation of the memory device 1. The control circuit 50 may include a CPU (Central Processing Unit), a RAM (Random Access Memory), a ROM (Read Only Memory), etc. The CPU can execute a control program or the like. The RAM is used as a work area of the CPU. The ROM includes a control program of the memory device 1, data referred to by the control program, etc. The control circuit 50 controls the first driver circuit 20, the second driver circuit 30 and the read circuit 40, based on, for example, a command or a control program received from an external controller, and can perform a read operation, a write operation, an erase operation, etc. In addition, the control circuit 50 can perform operations that can be used for reinforcement learning.

The sensor 60 is configured such that it can detect the state of a device that can be the target of reinforcement learning (the device may be hereinafter referred to as an agent as well), under the control of the control circuit 50. Then, the sensor 60 inputs a detection result to the control circuit 50.

The actuator 70 controls the agent under the control of the control circuit 50. The actuator 70 can cause the agent to execute an action instructed by the control circuit 50.

The memory device 1 may have a different configuration. For example, if reinforcement learning can be executed by software, the sensor 60 and the actuator 70 may be omitted from the memory device 1. The control circuit 50 may use an externally coupled RAM or ROM.

[1-1-2] Configuration of Memory Cell Array 10

In the memory device 1, a memory cell array 10 having a cross-point structure is used. An example of a configuration of the memory cell array 10 will be described below. In the drawings referred to below, the X direction corresponds to the extending direction of word lines WL, the Y direction corresponds to the extending direction of bit lines BL, and the Z direction corresponds to the direction vertical to the surface of the substrate on which the memory device 1 is formed.

(Circuit Configuration of Memory Cell Array 10)

Figure 2:
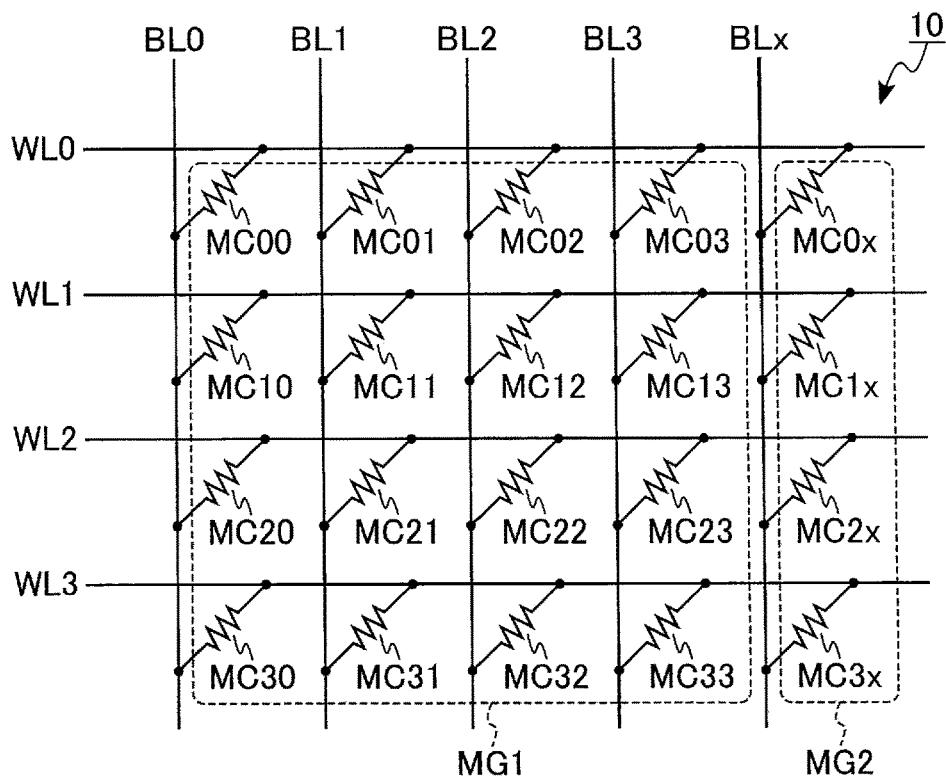
FIG. 2 is a circuit diagram illustrating an example of a circuit configuration of a memory cell array provided in the memory device of the first embodiment.

FIG. 2 is a circuit diagram illustrating an example of a circuit configuration of the memory cell array 10 provided in the memory device 1 of the first embodiment. As illustrated in FIG. 2, the memory cell array 10 includes, for example, word lines WL0 to WL3, bit lines BL0 to BL3 and BLx and a plurality of memory cells MC. The number of word lines WL and the number of bit lines BL may be different.

The plurality of word lines WL and the plurality of bit lines BL intersect each other. One memory cell MC is provided at the intersection of one word line WL and one bit line BL, and is coupled between the one word line WL and the one bit line BL.

Specifically, one end of each of the memory cells MC00, MC01, MC02, MC03 and MC0x is coupled to the word line WL0. One end of each of the memory cells MC10, MC11, MC12, MC13 and MC1x is coupled to the word line WL1. One end of each of the memory cells MC20, MC21, MC22, MC23 and MC2x is coupled to the word line WL2. One end of each of the memory cells MC30, MC31, MC32, MC33 and MC3x is coupled to the word line WL3.

The other end of each of the memory cells MC00, MC10, MC20 and MC30 is coupled to the bit line BL0. The other end of each of the memory cells MC01, MC11, MC21 and MC31 is coupled to the bit line BL1. The other end of each of the memory cells MC02, MC12, MC22 and MC32 is coupled to the bit line BL2. The other end of each of the memory cells MC03, MC13, MC23 and MC33 is coupled to the bit line BL3. The other end of each of the memory cells MC0x, MC1x, MC2x and MC3x is coupled to the bit line BLx.

In the memory device 1 of the first embodiment, the plurality of memory cells MC are classified into two memory groups MG. A memory group MG1 includes memory cells MC coupled to one of the bit lines BL0 to BL3. A memory group MG2 includes memory cells MC coupled to the bit line BLx. The memory group MG1 stores, for example, results of reinforcement learning. The memory group MG2 stores, for example, information referred to during reinforcement learning. Hereinafter, the memory cells MC coupled to the bit line BLx may be referred to as "reference cells" as well.

(Configuration of Memory Cell Array 10)

Figure 3:
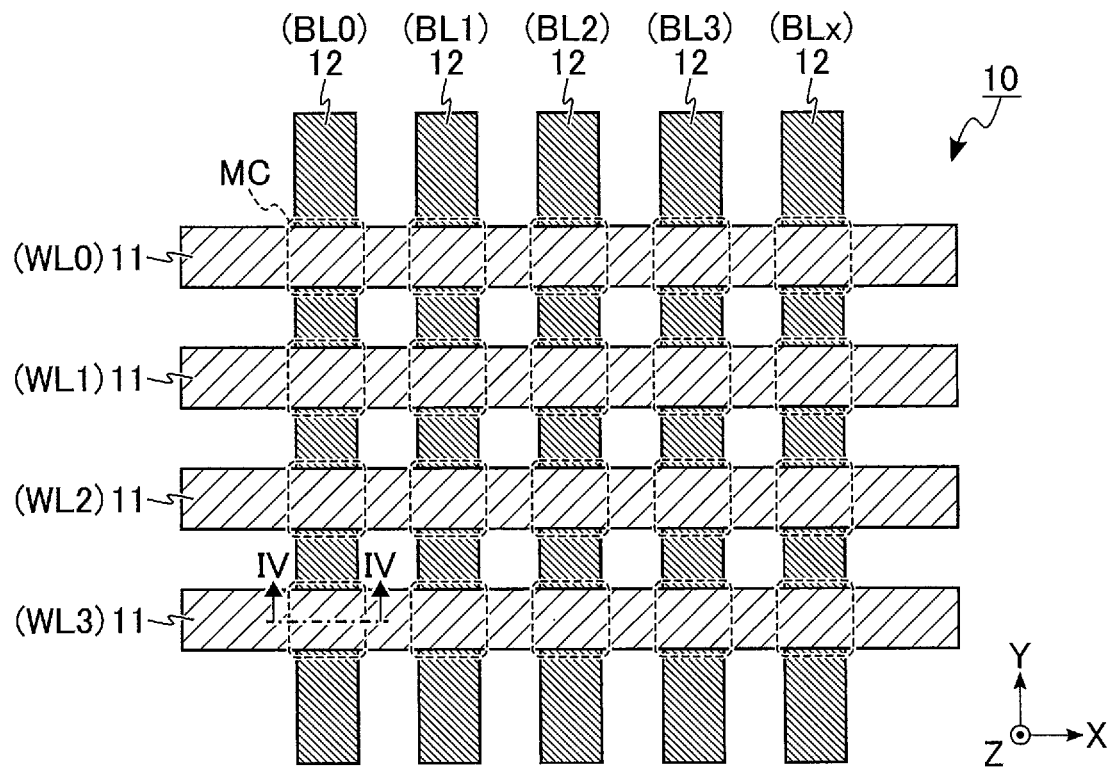
FIG. 3 is a plan view illustrating an example of a planar layout of the memory cell array provided in the memory device of the first embodiment.

FIG. 3 is a plan view illustrating an example of a planar layout of the memory cell array 10 provided in the memory device 1 of the first embodiment. As illustrated in FIG. 3, the memory cell array 10 includes a plurality of conductor layers 11 and a plurality of conductor layers 12.

Each conductor layer 11 has a portion extending in the X direction. The plurality of conductor layers 11 are arranged side by side in the Y direction. The plurality of conductor layers 11 are separate from each other. The plurality of conductor layers 11 are used as word lines WL0 to WL3, respectively. The number of conductor layers 11 corresponds to the number of word lines WL.

Each conductor layer 12 has a portion extending in the Y direction. The plurality of conductor layers 12 are arranged side by side in the X direction. The plurality of conductor layers 11 are separate from each other. The plurality of conductor layers 12 are used as bit lines BL0 to BL3 and BLx, respectively. The number of conductor layers 12 corresponds to the number of bit lines BL.

One memory cell MC is provided at each of the intersections of the conductor layers 11 and 12. In other words, the memory cell MC is provided at each of the plurality of intersections between the plurality of conductor layers 11 and the plurality of conductor layers 12. In the Z direction, each memory cell MC is sandwiched between one conductor layer 11 and one conductor layer 12.

Figure 4:
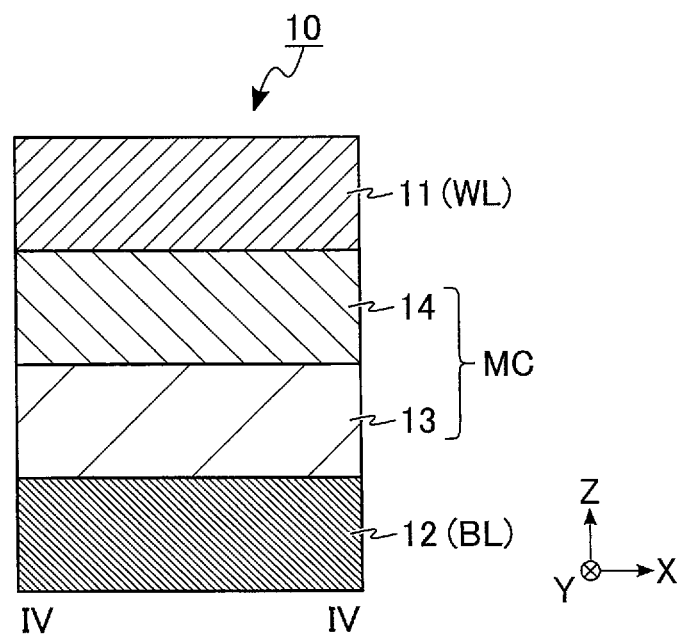
FIG. 4 is a cross-sectional view taken along line IV-IV of FIG. 3 and illustrating an example of a cross-sectional structure of the memory cell array provided in the memory device of the first embodiment.

FIG. 4 is a cross-sectional view taken along line IV-IV of FIG. 3 and illustrating an example of a cross-sectional structure of the memory cell array 10 provided in the memory device of the first embodiment. As illustrated in FIG. 4, the memory cell MC includes, for example, a paraelectric film 13 and a ferroelectric film 14.

The paraelectric film 13 is provided on the conductor layer 12 (bit line BL). The ferroelectric film 14 is provided on the paraelectric film 13. The conductor layer 11 (word line WL) is provided on the ferroelectric film 14. The dielectric constant of the paraelectric film 13 is lower than that of the ferroelectric film 14. Further, the hand gap of the dielectric film 13 is wider than that of the ferroelectric film 14. The paraelectric film 13 is, for example, a silicon oxide film, a silicon oxynitride film or a metal oxide. The ferroelectric film 14 is, for example, a hafnium oxide, a zirconium oxide, a compound of a hafnium oxide and a zirconium oxide or a silicate film (HfSiOx). Thus, the memory cell MC functions as a two-terminal FTJ (Ferroelectric Tunnel Junction) element sandwiched between the lower electrode (the conductor layer 12) and the upper electrode (the conductor layer 11).

The FTJ element is a kind of resistance changing element. The FTJ element can realize a low-current and low-voltage driving and high-speed switching, and has rectifying characteristics. In the memory cell MC, the direction in which electrons flow from the conductor layer 12 to the conductor layer 11 corresponds to the forward direction, and the direction in which electrons flow from the conductor layer 11 to the conductor layer 12 corresponds to the opposite direction. The resistance value of the memory cell MC may change, depending on the amount of polarization of the ferroelectric film 14. The amount of polarization of the ferroelectric film 14 changes when a forward write voltage or a reverse write voltage is applied to the memory cell MC. The resistance value of the memory cell MC decreases when the forward write voltage is applied and increases when the reverse write voltage is applied. The memory cell MC is not limited to the FTJ element. The memory cell MC may have other configurations as long as it is a resistance changing element having a rectifying function. In this example, the conductor layer 11 (word line WL) is provided above the conductor layer 12 (bit line BL), but the conductor layer 12 and the conductor layer 11 may be interchanged. The order in which the paraelectric film 13 and the ferroelectric film 14 are stacked in the memory cell MC may be changed in accordance with how the word line WL and the bit line BL are coupled.

[1-1-3] Configuration of Peripheral Circuits

FIG. 5 is a block diagram illustrating an example of configurations of peripheral circuits (a first driver circuit 20, a second driver circuit 30 and a read circuit 40) of the memory cell array 10 provided in the memory device 1 of the first embodiment. As illustrated in FIG. 5, the first driver circuit 20 includes a plurality of voltage generators 21 and a plurality of transistors 22. The second driver circuit 30 includes a plurality of voltage generators 31 and a plurality of transistors 32. The read circuit 40 includes, for example, a plurality of sense circuits 41, a plurality of transistors 42, a comparison circuit 43 and a measurement circuit 44.

Each of the plurality of voltage generators 21 is coupled to one end of the corresponding one of the plurality of transistors 22. The other ends of the plurality of transistors 22 are coupled to the plurality of word lines WL0 to WL3, respectively. The voltage generator 21 generates a voltage under the control of the control circuit 50. The voltage generator 21 applies the generated voltage to the associated word line WL via the transistor 22. The voltage generated by each voltage generator 21 can be individually controlled by the control circuit 50. The gate voltage of each of the plurality of transistors 22 can be individually controlled by the control circuit 50.

Each of the plurality of voltage generators 31 is coupled to one end of the corresponding one of the plurality of transistors 32. The other ends of the plurality of transistors 32 are coupled to the plurality of bit lines BL0 to BL3 and BLx, respectively. The voltage generator 31 generates a voltage under the control of the control circuit 50. The voltage generator 31 applies the generated voltage to the associated bit line BL via the transistor 32. The voltage generated by each voltage generator 31 can be individually controlled by the control circuit 50. The gate voltage of each of the plurality of transistors 32 can be individually controlled by the control circuit 50.

Each of the plurality of sense circuits 41 is coupled to one end of the corresponding one of the plurality of transistors 42. The other ends of the plurality of transistors 42 are coupled to the plurality of bit lines BL0 to BL3 and BLx, respectively. A current flowing in the associated bit line BL can flow into the sense circuit 41 through the transistor 42. Based on the flowing current, the sense circuit 41 can determine data stored in the memory cell MC. The sense circuit 41 may have a circuit configuration that determines data stored in the memory cell MC, based on the voltage of the bit line BL.

The comparison circuit 43 is coupled to, for example, the sense circuits 41 coupled to the bit lines BL associated with the memory group MG1. The comparison circuit 43 compares current values of the plurality of bit lines BL associated with the memory group MG1. The comparison circuit 43 notifies the control circuit 50 of information on the bit line BL which is one of the plurality of bit lines BL associated with the memory group MG1 and through which the largest amount of current flows. As the comparison circuit 43, a Winner-Take-All circuit can be used. The Winner-Take-All circuit is a circuit that selects a maximum current from a plurality of current inputs. The input impedance of the Winner-Take-All circuit is negligibly small as compared with the resistance value of the memory cell MC. The comparison circuit 43 does not have to be coupled to the bit lines BL via the sense circuits 41. The comparison circuit 43 is only required to be able to detect currents of the bit lines BL associated with the memory group MG1.

The measurement circuit 44 is coupled to, for example, the sense circuit 41 coupled to the bit line BL associated with the memory group MG2. The measurement circuit 44 measures a current value of the bit line BLx associated with the memory group MG2. The measurement circuit 44 notifies the control circuit 50 of a measurement result of the current value flowing through the bit line BLx. The measurement circuit 44 does not have to be coupled to the bit line BL via the sense circuit 41. The measurement circuit 44 is only required to be able to detect a current of the bit line BLx associated with the memory group MG2.

The peripheral circuit may have other configurations. For example, the second driver circuit 30 does not have to be coupled to one end of the bit line BL, and the read circuit 40 does not have to be coupled to the other end of the bit line BL. That is, both the second driver circuit 30 and the read circuit 40 may be coupled on one side of the bit line BL.

The second driver circuit 30 and the read circuit 40 may be integrated or may have other configurations as long as the above-described functions can be realized. The comparison circuit 43 and the measurement circuit 44 may be included in the control circuit 50. The voltage generator 21 does not have to be provided for each word line WL, and the voltage generator 31 does not have to be provided for each bit line BL. A voltage generator may be appropriately shared as long as it can apply desired voltages to the bit lines BL and the word lines WL.

[1-1-4] Configuration of Control Circuit 50

FIG. 6 is a block diagram illustrating an example of the functional configuration of a control circuit 50 provided in the memory device 1 of the first embodiment. As illustrated in FIG. 6, the control circuit 50 includes, for example, a state acquisition unit 51, a trial control unit 52, a first driver control unit 53, a second driver control unit 54, a read control unit 55, an action execution unit 56 and a memory unit 57. Each functional configuration of the control circuit 50 of the first embodiment is realized, for example, by a CPU, a RAM or the like included in the control circuit 50.

The state acquisition unit 51 receives a detection result of a sensor 60. From the received measurement result, the state acquisition unit 51 confirms which of the pre-classified states corresponds to the state of the agent. The state acquisition unit 51 notifies the trial control unit 52 of the confirmed state of the agent.

The trial control unit 52 controls the entire memory operation and trial operation described later. The trial control unit 52 selects a word line WL, based on the state of the measurement target notified by the state acquisition unit 51, and executes a read operation or a write operation. Further, the trial control unit 52 causes the action execution unit 56 to execute an instruction that is based on the result of the read operation.

The first driver control unit 53 controls the first driver circuit 20 under the control of the trial control unit 52.

The second driver control unit 54 controls the second driver circuit 30 under the control of the trial control unit 52.

The read control unit 55 controls the read circuit 40 under the control of the trial control unit 52. The read control unit 55 receives a comparison result and a measurement result from the read circuit 40. The comparison result includes information on the bit line BL having the largest amount of current. The read control unit 55 transfers the received comparison result to the trial control unit 52. The measurement result includes information on the amount of current. The read control unit 55 transfers the received measurement result to the memory unit 57.

The action execution unit 56 controls the actuator 70 under the control of the trial control unit 52. The agent can execute the action specified by the trial control unit 52 under the control of the actuator 70. For example, the action execution unit 56 generates a mechanical signal for executing a specified action.

The memory unit 57 stores information referred to during reinforcement learning. For example, the memory unit 57 stores reference information RI. The reference information RI accumulates the measurement result information (reference value RV described later) received from the read control unit 55. For example, each reference value RV is stored such that the storing time can be known. For example, time information is associated with each reference value RV. The trial control unit 52 can change the method of reinforcement learning in accordance with the state of the reference information RI.

[1-2] Operation

Next, a description will be given of the operation performed by the memory device 1 of the first embodiment. In the description below, a memory cell MC that is selected will be referred to as a selected memory cell MC. The word line WL and the bit line BL that are associated with the selected memory cell MC will be referred to as a selected word line WL and a selected bit line BL, respectively. The word lines WL other than the selected word line WL will be referred to as non-selected word lines WL. The bit lines BL other than the selected bit line BL will be referred to as non-selected bit lines BL. A memory cell MC coupled to a selected word line WL and coupled to a non-selected bit line BL and a memory cell MC coupled to a selected bit line BL and coupled to a non-selected word line WL will be referred to as half-selected memory cells MC. A memory cell MC coupled to a non-selected word line WL and coupled to a non-selected bit line BL will be referred to as a non-selected memory cell MC. The application of a voltage to a word line WL corresponds to the state where the voltage generator 21 applies the voltage to the word line WL via the transistor 22. The application of a voltage to a bit line BL corresponds to the state where the voltage generator 31 applies the voltage to the bit line BL via the transistor 32. The state where no voltage is applied to the bit line BL corresponds to the state where the transistor 32 is in the OFF state.

[1-2-1] Read Operation

The memory device 1 of the first embodiment can execute a first read operation and a second read operation under the control of the control circuit 50. Details of the first read operation and the second read operation will be described below.

(First Read Operation)

Figure 7:
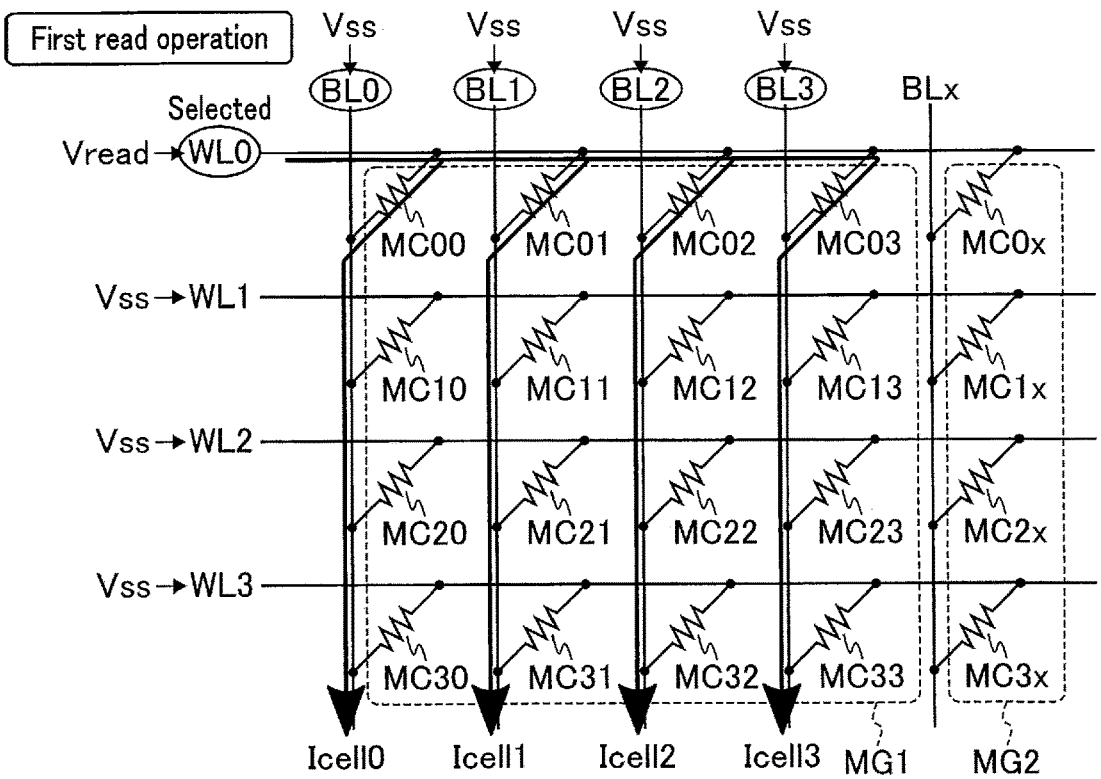
FIG. 7 is a schematic view illustrating an example of how a first read operation is performed in the memory device of the first embodiment.

FIG. 7 is a schematic view illustrating an example of how the first read operation is performed in the memory device 1 of the first embodiment, and shows voltages applied to the respective interconnects at a certain point of time. As illustrated in FIG. 7, in the first read operation, the control circuit 50 executes a read operation in which one word line WL and a plurality of bit lines BL are selected. The first read operation will be described, referring to the case where the word line WL0 and the bit lines BL0 to BL3 are selected.

Vread is applied to the selected word line WL0. Vss is applied to each of the non-selected word lines WL1 to WL3. Vss is applied to each of the selected bit lines BL0 to BL3. For example, no voltage is applied to the non-selected bit line BLx, or Vread/2 is applied thereto. Vss is the ground voltage (for example, 0V). Vread is a read voltage higher than Vss.

As described above, in the first read operation, a forward voltage is applied to each of the selected memory cell MC and the half-selected memory cell MC. The voltage difference across the selected memory cell MC is greater than the voltage difference across the half-selected memory cell MC. The voltage difference across the selected memory cell MC is, for example, equal to or greater than the threshold voltage of the memory cell MC that stores "0" data. The voltage difference across the half-selected memory cell MC is lower than, for example, the threshold voltage of the memory cell MC that stores "0" data. A substantially same voltage is applied across the non-selected memory cell MC, and the voltage difference across the non-selected memory cell MC is thus suppressed.

As a result, currents can flow from the selected word line WL0 via the selected memory cells MC00, MC01, MC02 and MC03, respectively. A read current Icell0 flowing through the selected bit line BL0 via the selected memory cell MC00, a read current Icell1 flowing through the selected bit line BL1 via the selected memory cell MC01, a read current Icell2 flowing through the selected bit line BL2 via the selected memory cell MC02 and a read current Icell3 flowing through the selected bit line BL3 via the selected memory cell MC03 are supplied to the comparison circuit 43 included in the read circuit 40. In the half-selected memory cell MC0x, a read current is suppressed, and the disturbance with respect to the half-selected memory cell MC0x is thus suppressed.

In the first read operation performed in the first embodiment, the comparison circuit 43 in the read circuit 40 detects which bit line BL has the largest read current from among the selected bit lines BL associated with the memory group MG1, and the control circuit 50 is notified of this detection result.

(Second Read Operation)

Figure 8:
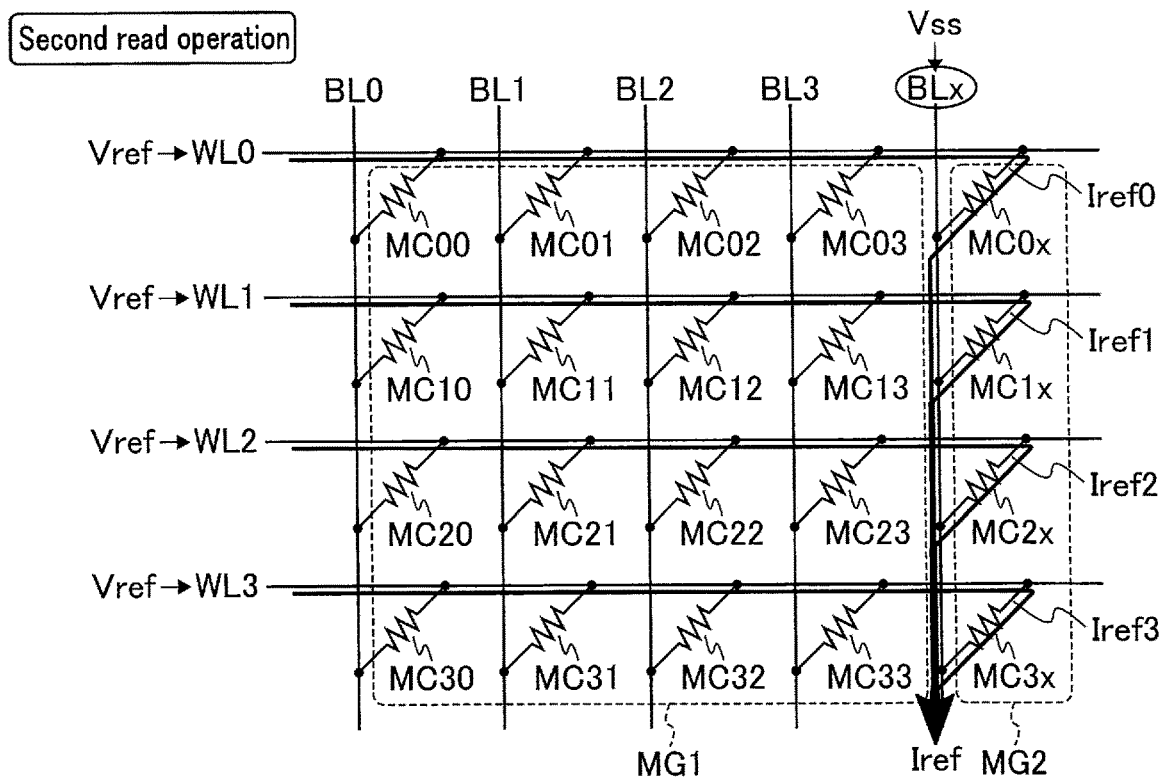
FIG. 8 is a schematic view illustrating an example of how a second read operation is performed in the memory device of the first embodiment.

FIG. 8 is a schematic view illustrating an example of how the second read operation is performed in the memory device 1 of the first embodiment, and shows voltages applied to respective interconnects at a certain point of time. As illustrated in FIG. 8, in the second read operation, the control circuit 50 executes a read operation in which a plurality of word lines WL and one bit line BL are selected. The second read operation will be described, referring to the case where the word lines WL0 to WL3 and the bit line BLx are selected.

Vref is applied to each of the selected word lines WL0 to WL3. Vss is applied to the selected bit line BLx. For example, no voltage is applied to the non-selected bit line BL, or Vread/2 is applied thereto. Vref is a read voltage higher than Vss.

As described above, in the second read operation, a forward voltage is applied to each of the selected memory cells MC and the half-selected memory cells MC. The voltage difference across the selected memory cell MC is greater than the voltage difference across the half-selected memory cell MC. The voltage difference across the selected memory cell MC is, for example, equal to or greater than the threshold voltage of the memory cell MC that stores "0" data. The voltage difference across the half-selected memory cell MC is lower than, for example, the threshold voltage of the memory cell MC that stores "0" data. A substantially same voltage is applied across the non-selected memory cell MC, and the voltage difference across the non-selected memory cell MC is thus suppressed.

As a result, currents can flow from the selected word lines WL0 to WL3 via the selected memory cells MC0x, MC1x, MC2x and MC3x, respectively. A read current Iref0 flowing through the selected bit line BLx via the selected memory cell MC0x, a read current Iref1 flowing through the selected bit line BLx via the selected memory cell MC1x, a read current Iref2 flowing through the selected bit line BLx via the selected memory cell MC2x and a read current Iref3 flowing through the selected bit line BLx via the selected memory cell MC3x are supplied to the measurement circuit 44 in the read circuit 40. In the half-selected memory cell MC, a read current is suppressed, and the disturbance with respect to the half-selected memory cell MC is thus suppressed.

In the second read operation performed in the first embodiment, the measurement circuit 44 in the read circuit 40 measures the sum (reference current Iref) of read currents flowing through the plurality of selected memory cells MC associated with the memory group MG2, and the control circuit 50 is notified of this measurement result.

[1-2-2] Write Operation

The memory device 1 of the first embodiment can execute a first write operation and a second write operation under the control of the control circuit 50. The first write operation is a write operation that lowers the resistance value of the selected memory cell MC. The second write operation is a write operation that raises the resistance value of the selected memory cell MC. Details of the first write operation and the second write operation will be described below.

(First Write Operation)

FIG. 9 is a schematic view illustrating an example of how the first write operation is performed in the memory device 1 of the first embodiment, and shows voltages applied to the respective interconnects at a certain point of time. As illustrated in FIG. 9, the control circuit 50 executes the first write operation in which, for example, one memory cell MC is selected. The first write operation will be described below, referring to the case where the memory cell MC00 is selected.

Vset is applied to the selected word line WL0. Vset/2 is applied to each of the non-selected word lines WL1 to WL3. Vss is applied to the selected bit line BL0. Vset/2 is applied to the non-selected bit line BL. Vset is a forward write voltage higher than Vread.

As described above, in the first write operation, a forward voltage is applied to each of the selected memory cell MC and the half-selected memory cell MC. The voltage difference across the selected memory cell MC can be at least equal to or greater than the forward write voltage. The voltage difference across the half-selected memory cell MC is lower than the forward write voltage. A substantially same voltage is applied across the non-selected memory cell MC, and the voltage difference across the non-selected memory cell MC is thus suppressed.

As a result, the amount of polarization of the ferroelectric film 14 of the selected memory cell MC00 to which the forward write voltage is applied changes, and the resistance value of the selected memory cell MC00 decreases. On the other hand, changes in the resistance values of the half-selected memory cell MC and the non-selected memory cell MC are suppressed. Where the first write operation is performed for a plurality of memory cells MC, the control circuit 50 may change the resistance values of the selected memory cells MC one by one, as described with reference to FIG. 9; alternatively, the resistance values of the plurality of selected memory cells MC may be changed collectively. Where the resistance values of the plurality of selected memory cells MC are changed collectively in the first write operation, for example, one word line WL and a plurality of bit lines BL are selected.

(Second Write Operation)

FIG. 10 is a schematic view illustrating an example of how the second write operation is performed in the memory device 1 of the first embodiment, and shows voltages applied to respective interconnects at a certain point of time. As illustrated in FIG. 10, the control circuit 50 selects, for example, one memory cell MC and executes the second write operation. The second write operation will be described below, referring to the case where the memory cell MC00 is selected.

Vreset is applied to the selected word line WL0. Vreset/2 is applied to each of the non-selected word lines WL1 to WL3. Vss is applied to the selected bit line BL0. Vreset/2 is applied to the non-selected bit line BL. Vreset is a reverse write voltage lower than Vss.

As described above, in the second write operation, a reverse voltage is applied to each of the selected memory cell MC and the half-selected memory cell MC. The voltage difference across the selected memory cell MC can be at least equal to or lower than the reverse write voltage. The voltage difference across the half-selected memory cell MC is higher than the reverse write voltage. A substantially same voltage is applied across the non-selected memory cell MC, and the voltage difference across the non-selected memory cell MC is thus suppressed.

As a result, the amount of polarization of the ferroelectric film 14 of the selected memory cell MC00 to which the reverse write voltage is applied changes, and the resistance value of the selected memory cell MC00 increases. On the other hand, changes in the resistance values of the half-selected memory cell MC and the non-selected memory cell MC are suppressed. Where the second write operation is performed for a plurality of memory cells MC, the control circuit 50 may change the resistance values of the selected memory cells MC one by one, as described with reference to FIG. 10; alternatively, the resistance values of the plurality of selected memory cells MC may be changed collectively. Where the resistance values of the plurality of selected memory cells MC are changed collectively in the second write operation, for example, one word line WL and a plurality of bit lines BL are selected.

[1-2-3] Outline of Reinforcement Learning

Figure 11:
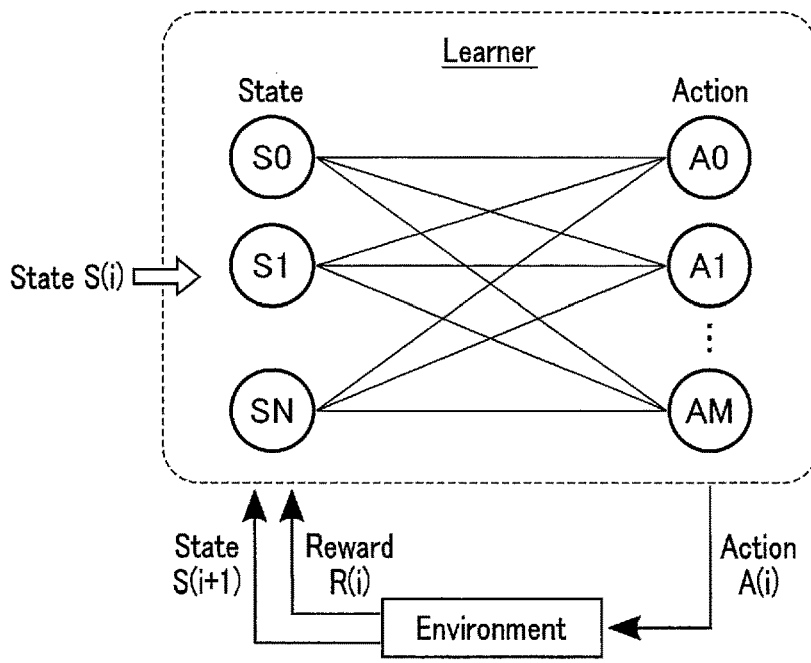
FIG. 11 is a schematic diagram illustrating an example of a reinforcement learning algorithm.

FIG. 11 is a schematic diagram illustrating an example of a reinforcement learning algorithm. As illustrated in FIG. 11, the learner (agent) can perform reinforcement learning. Reinforcement learning is a method of learning how to maximize the reward for success through trial and error.

Specifically, the agent first observes a current state S(i) (i is an integer of 0 or more) under a certain environment (state observation). One or more parameters are used for the state S(i). For example, each parameter is divided into a plurality of regions each having a predetermined range. One state S is set for each combination between the plurality of parameters. In this example, states S0 to SN (N is an integer of 1 or more) are set.

Then, the agent determines an action A(i) to be taken for the current state S(i) (action selection). Each action A is an action that the agent can perform. In this example, actions A0 to AM (M is an integer of 1 or more) are set. The agent confirms the action A(i) associated with the state S(i) and executes the action A(i).

After the action A(i) is executed, the state S(i) of the agent changes to the state S(i+1). The agent obtains a reward R(i) from the environment in accordance with the result of the change to the state S(i+1) (reward reception). Where the state S(i+1) satisfies a predetermined condition, the agent obtains a success reward as the reward R(i). On the other hand, where the state S(i+1) does not satisfy the predetermined condition, the agent gets a penalty as the reward R(i). In the description below, the process of giving a success reward to the agent will be referred to as a reward process, and the process of giving a penalty to the agent will be referred to a penalty process.

In reinforcement learning, the agent repeatedly performs the series of the above actions, including the state observation, the action selection and the reward reception, so as to learn a method in which the most successful reward can be obtained (a combination of state S and action A). In the memory device 1 of the first embodiment, the memory cell array 10 having a cross-point structure is used for reinforcement learning.

Figure 12:
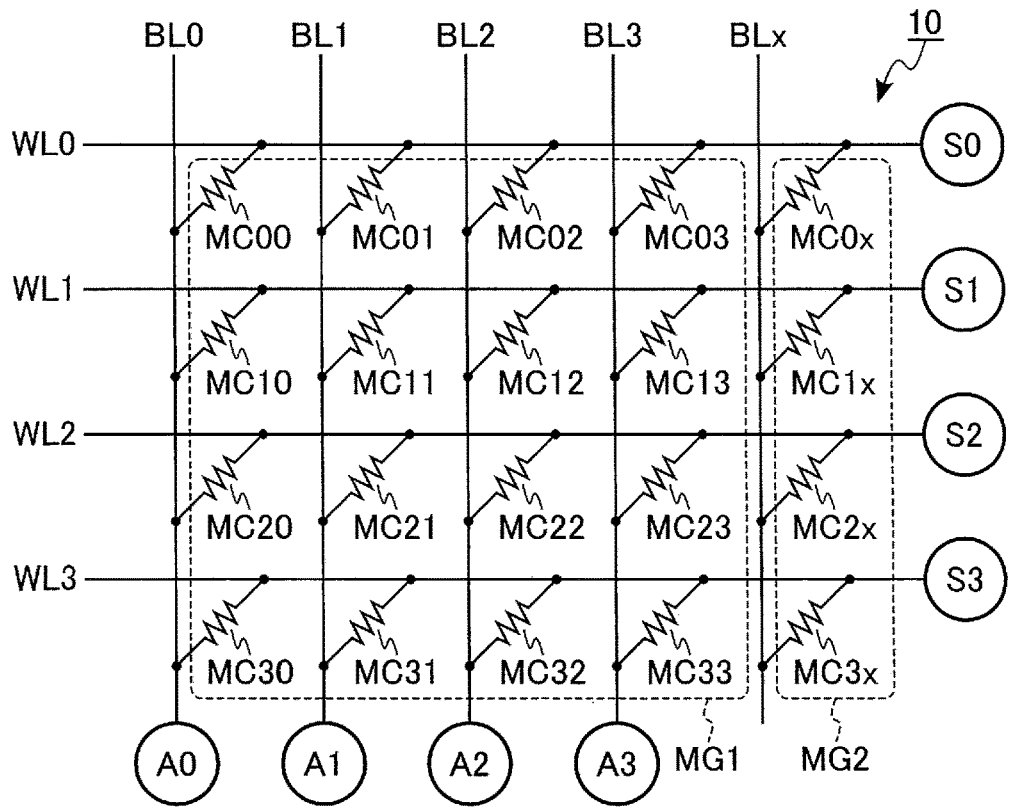
FIG. 12 is a schematic view illustrating an example of how a reinforcement learning function is assigned to the memory cell array provided in the memory device of the first embodiment.

FIG. 12 is a schematic view illustrating an example of how a reinforcement learning function is assigned to the memory cell array 10 provided in the memory device 1 of the first embodiment. As illustrated in FIG. 12, in the memory device 1 of the first embodiment, states S0 to S3 are assigned to the word lines WL0 to WL3, respectively, and actions A0 to A3 are assigned to the bit lines BL0 to BL3, respectively.

That is, in the memory device 1, the state S(i) of the agent is associated with the address of the word line WL. The control circuit 50 can select the address of the word line WL in accordance with the state S(i) of the agent. For example, in the first read operation, the control circuit 50 identifies and selects which bit line BL has the largest read current from among the plurality of bit lines BL coupled to the selected word line WL and associated with the memory group MG1.

Similarly, the action A(i) of the agent is associated with the address of the bit line BL. The control circuit 50 can cause the agent to execute the action A(i) derived from the selected state S. For example, the control circuit 50 executes the action A(i) associated with the bit line BL selected in the first read operation. As a result, the state S(i) of the agent changes to a new state S(i+1).

Where the state S(i+1) satisfies a predetermined condition (success condition), the control circuit 50 executes a reward process for the executed action. The reward process includes a first write operation in which the memory cell MC (selected memory cell MC) associated with the state S(i) and the action A(i) is targeted. On the other hand, where the state S(i+1) does not satisfy the predetermined condition (success condition), the control circuit 50 executes a penalty process for the executed action. The penalty process includes a second write operation in which the selected memory cell MC is targeted. That is, the resistance value of the selected memory cell MC decreases where the reward process is executed and increases where the penalty process is executed.

As described above, in the memory device 1 of the first embodiment, the actions A0 to A3 are assigned to the plurality of bit lines BL associated with the memory group MG1. On the other hand, the action A is not assigned to the bit line BLx associated with the memory group MG2. Each of the memory cells MC0x, MC1x, MC2x and MC3x coupled to the bit lines BLx is used as a reference cell during reinforcement learning. In the memory operation, the control circuit 50 can execute, for the reference cell, an operation that is similar to the reward process or penalty process performed for the selected memory cells MC sharing the word line WL.

[1-2-4] Memory Operation

The memory device 1 of the first embodiment can execute a memory operation under the control of the control circuit 50. The memory operation includes a first trial process and a second trial process. Each trial process includes a series of actions including state observation, action selection and reward reception. A detained description will be given of the first trial process, the second trial process, a specific example of a write operation executed in each of the first trial process and the second trial process, and a memory operation performed in the first embodiment.

In the description below, a "memory cell MC in the state S(i)" indicates a memory cell MC coupled to the word line WL to which the state S(i) is assigned. The "selected memory cell MC in the state S(i)" indicates a memory cell MC coupled to the word line WL to which the state S(i) is assigned and the bit line BL to which a selected action A(i) is assigned. The "non-selected memory cell MC in the state S(i)" indicates a memory cell MC coupled to the word line WL to which the state S(i) is assigned and the bit line BL to which a non-selected action A is assigned.

(First Trial Process)

Figure 13:
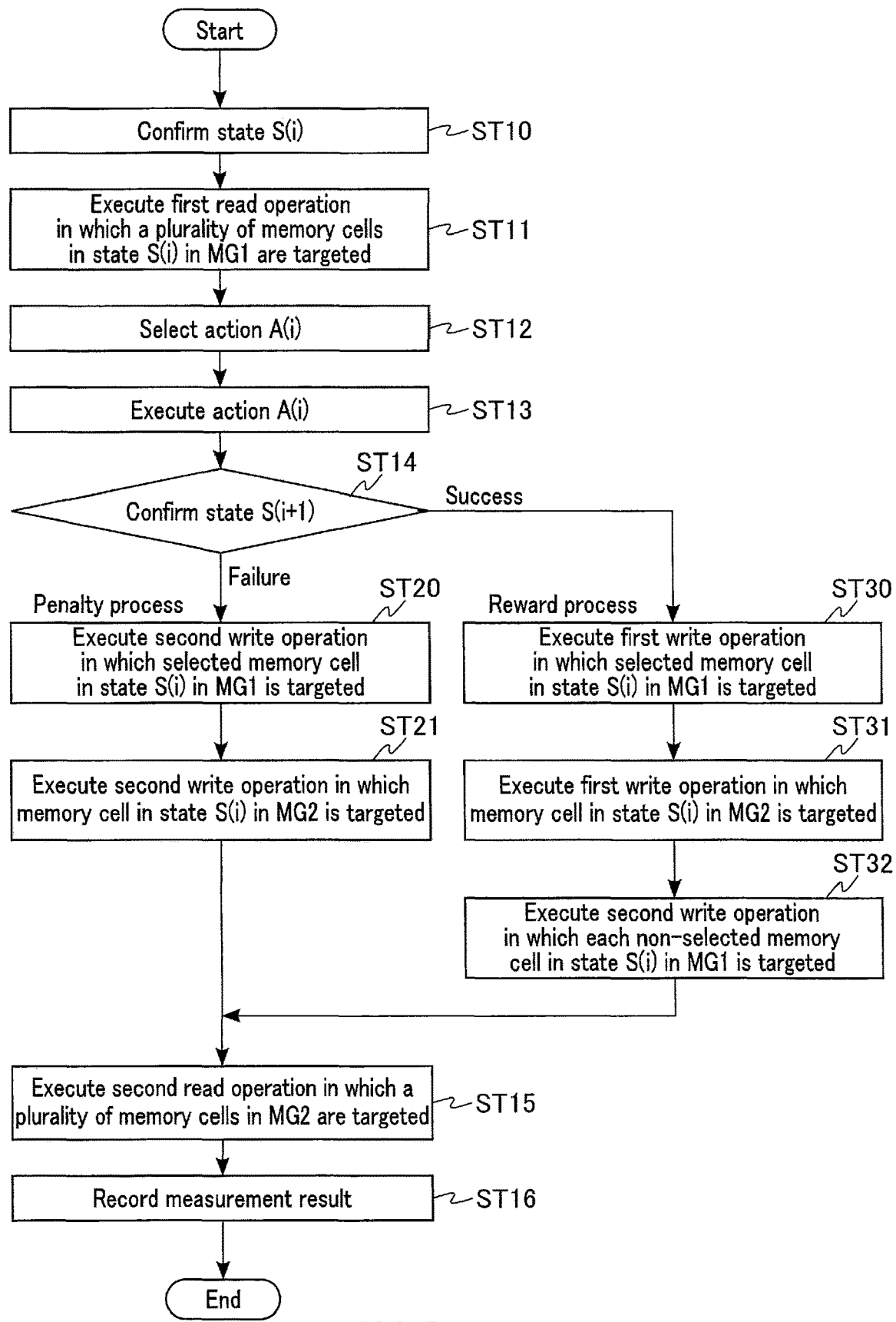
FIG. 13 is a flowchart illustrating an example of how a first trial process is performed in the memory device of the first embodiment.

FIG. 13 is a flowchart illustrating an example of how a first trial process is performed in the memory device 1 of the first embodiment. As illustrated in FIG. 13, the memory device 1 can execute the processes of steps ST10 to ST16, ST20, ST21 and ST30 to ST32 in the first trial process. Details of the first trial process will be described below.

The control circuit 50 starts the first trial process, for example, according to the flow of the memory operation performed in the memory device 1 of the first embodiment described later (Start).

First, the control circuit 50 (trial control unit 52) confirms the state S(i) of the agent (step ST10). Various methods can be applied to how the initial state S(i) in each trial process is set. For example, the state S(i) may be set by the control circuit 50 or may be set based on information externally entered.

Next, the control circuit 50 executes a first read operation in which a plurality of memory cells MC in the state S(i) in the memory group MG1 are targeted (step ST11). In other words, the control circuit 50 selects word lines WL assigned to the state S(i) and executes a first read operation for the plurality of memory cells MC included in the memory group MG1. In the first read operation, the control circuit 50 confirms which bit line BL of the plurality of bit lines associated with the memory group MG1 has the maximum read current.

Next, the control circuit 50 selects the action A(i) (step ST12). Specifically, the action execution unit 56 executes the action A(i) associated with the bit line BL selected based on the result of the first read operation of step ST11, under the control of the trial control unit 52. Thus, the state of the agent changes from the state S(i) to the state S(i+1).

Next, the control circuit 50 confirms the state S(i+1) (step ST12). The control circuit 50 grasps the state S(i+1) based on, for example, a detection result of the sensor 60. Then, the control circuit 50 confirms whether the state S(i+1) satisfies the predetermined condition ("success") or does not satisfy the predetermined condition ("failure"). This predetermined condition can be appropriately determined for each target of reinforcement learning.

When it is confirmed in the process of step ST14 that the predetermined condition is not satisfied, the control circuit 50 executes a penalty process (step ST14, failure). In the penalty process of the first trial process, the control circuit 50 sequentially executes the processes of steps ST20 and ST21. The order in which the processes of steps ST20 and ST21 are executed may be determined differently.

In the process of step ST20, the control circuit 50 executes a second write operation in which the selected memory cell MC in the state S(i) in the memory group MG1 is targeted. By the process of step ST20, the resistance value of the selected memory cell MC in the state S(i) is increased in the memory group MG1.

In the process of step ST21, the control circuit 50 executes a second write operation in which the memory cell MC in the state S(i) in the memory group MG2 is targeted. By the process of step ST21, the resistance value of the memory cell MC (reference cell) in the state S(i) is increased in the memory group MG2.

When it is confirmed in the process of step ST14 that the predetermined condition is satisfied, the control circuit 50 executes a reward process (step ST14, success). In the reward process of the first trial process, the control circuit 50 sequentially executes the processes of steps ST30, ST31 and ST32. The order in which the processes of steps ST30, ST31 and ST32 are executed may be determined differently.

In the process of step ST30, the control circuit 50 executes the first write operation in which the selected memory cell MC in the state S(i) in the memory group MG1 is targeted. By the process of step ST30, the resistance value of the selected memory cell MC in the state S(i) is lowered in the memory group MG1.

In the process of step ST31, the control circuit 50 executes a first write operation in which the memory cell MC in the state S(i) in the memory group MG2 is targeted. By the process of step ST31, the resistance value of the memory cell MC (reference cell) in the state S(i) is lowered in the memory group MG2.

In the process of step ST32, the control circuit 50 executes a second write operation in which each of the non-selected memory cells MC in the state S(i) in the memory group MG1 is targeted. This second write operation may be executed individually for each of the non-selected memory cells MC, or may be executed collectively for the non-selected memory cells MC. By the process of step ST32, the resistance value of each non-selected memory cell MC in the state S(i) is increased in the memory group MG1.

After the penalty process or the reward process, the control circuit 50 executes a second read operation in which a plurality of memory cells MC (reference cells) in the memory group MG2 are targeted (step ST15). In the process of step ST15, the measurement circuit 44 of the read circuit 40 measures the total value (reference value RV) of the read currents flowing through the plurality of memory cells MC coupled to the bit line BLx. In other words, in the process of step ST15, the sum of the read currents flowing-through all reference cells is read and measured.

Next, the control circuit 50 records the measurement result (step ST16). Specifically, the memory unit 57 of the control circuit 50 records the reference value RV measured by the process of step ST15 in the reference information RI. Then, the control circuit 50 ends the first trial process (End).

(Second Trial Process)

Figure 14:
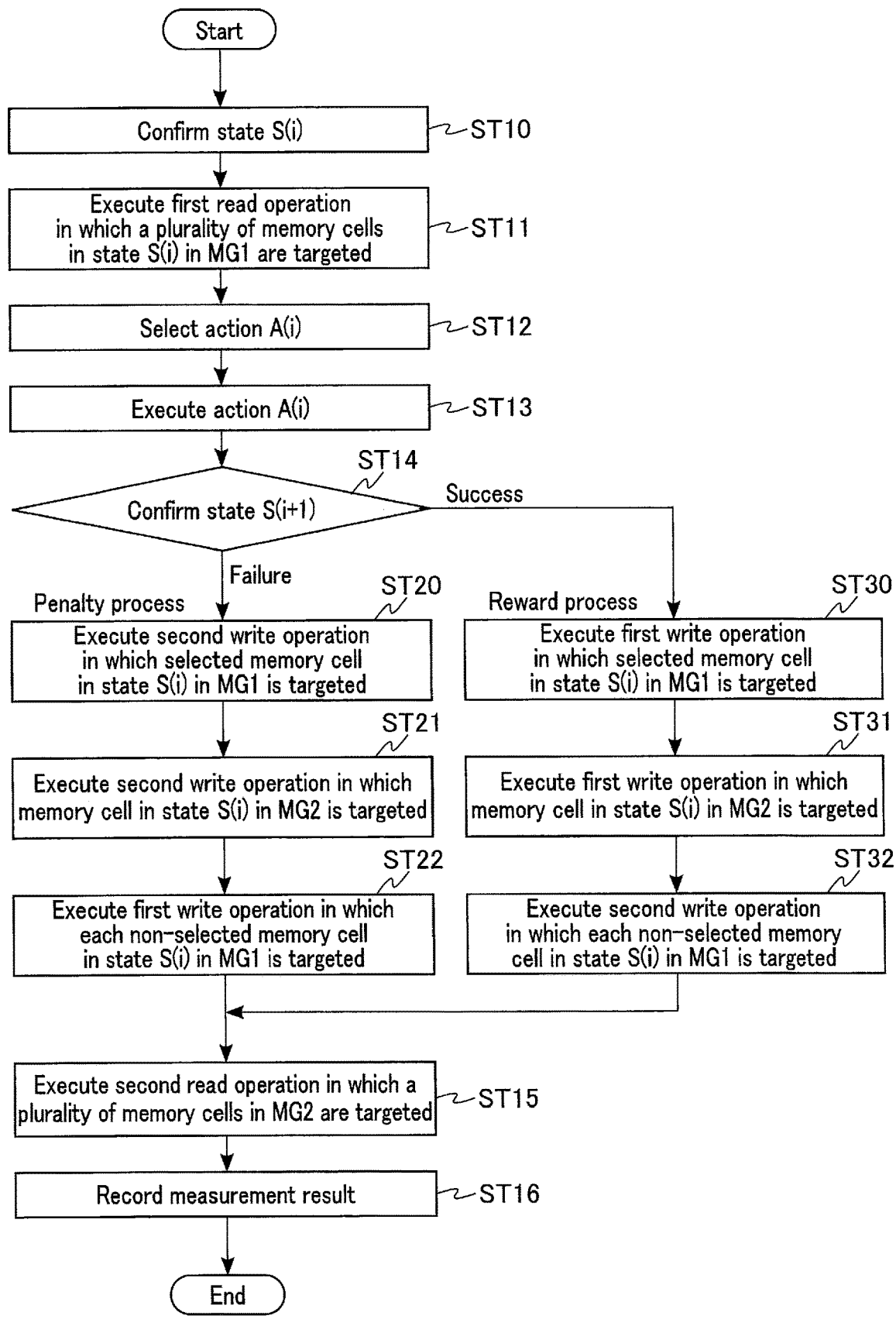
FIG. 14 is a flowchart illustrating an example of how a second trial process is performed in the memory device of the first embodiment.

FIG. 14 is a flowchart illustrating an example of how a second trial process is performed in the memory device 1 of the first embodiment. As illustrated in FIG. 14, the memory device 1 can execute the processes of steps ST10 to ST16, ST20 to ST22 and ST30 to ST32 in the second trial process. Details of the second trial process will be described below.

The control circuit 50 (the trial control unit 52) starts the second trial process, for example, according to the flow of the memory operation performed in the memory device 1 of the first embodiment described later (Start).

First, the control circuit 50 sequentially executes the processes of steps ST10 to ST14 in the same manner as in the first trial process. When the process of step ST14 is completed, the control circuit 50 executes a penalty process or a reward process.

In the penalty process (step ST14, failure) of the second trial process, the control circuit 50 sequentially executes the processes of steps ST20, ST21 and ST22. The order in which the processes of steps ST20, ST21 and ST22 are executed may be determined differently.

The processes of steps ST20 and ST21 of the second trial process are similar to those of steps ST20 and ST21 of the first trial process, respectively.

In the process of step ST22, the control circuit 50 executes a first write operation in which each non-selected memory cell MC in the state S(i) in the memory group MG1 is targeted. This first write operation may be executed individually for each of the non-selected memory cells MC, or may be executed collectively for the non-selected memory cells MC. By the process of step ST22, the resistance value of each non-selected memory cell MC in the state S(i) is lowered in the memory group MG1.

In the reward process (step ST14, success) of the second trial process, the control circuit 50 sequentially executes the processes of steps ST30, ST31 and ST32, as in the first trial process.

After the penalty process or the reward process, the control circuit 50 sequentially executes the processes of steps ST15 and ST16, as in the first trial process. When the process of step ST16 is completed, the control circuit 50 ends the second trial process (End).

(Specific Examples of Penalty Process and Reward Process)

FIG. 15 and FIG. 16 are tables illustrating an example of how a write operation is executed for the memory cells MC that are selected in the first and second trial processes performed in the memory device 1 of the first embodiment. Each of FIGS. 15 and 16 illustrates examples of voltages that are applied to selected word lines WL in the write operations executed in the penalty process and the reward process when the measure associated with the memory cell MC00 is selected. "Selected" in the "attribute" item indicates that a memory cell MC is selected. "Non-selected" in the "attribute" item indicates that a memory cell MC is not selected. "Reference" in the "attribute" item indicates that a memory cell MC is a reference cell.

As illustrated in FIG. 15, in the penalty process of the first trial process, Vreset is applied to each of the selected memory cell MC00 and the memory cell MC0x (reference cell), and the write operation for each of the non-selected memory cells MC01, MC02, and MC03 is omitted. In the reward process of the first trial process, Vset is applied to each of the selected memory cell MC00 and the memory cell MC0x (reference cell), and Vreset is applied to each of the non-selected memory cells MC01, MC02 and MC03.

As illustrated in FIG. 16, in the penalty process of the second trial process, Vreset is applied to each of the selected memory cell MC00 and the memory cell MC0x (reference cell), and Vset is applied to each of the non-selected memory cells MCO1, MC02 and MC03. In the reward process of the second trial process, Vset is applied to each of the selected memory cell MC00 and the memory cell MC0x (reference cell), as in the first trial process, and Vreset is applied to each of the non-selected memory cells MC01, MC02 and MC03.

(Details of Memory Operation)

Figure 17:
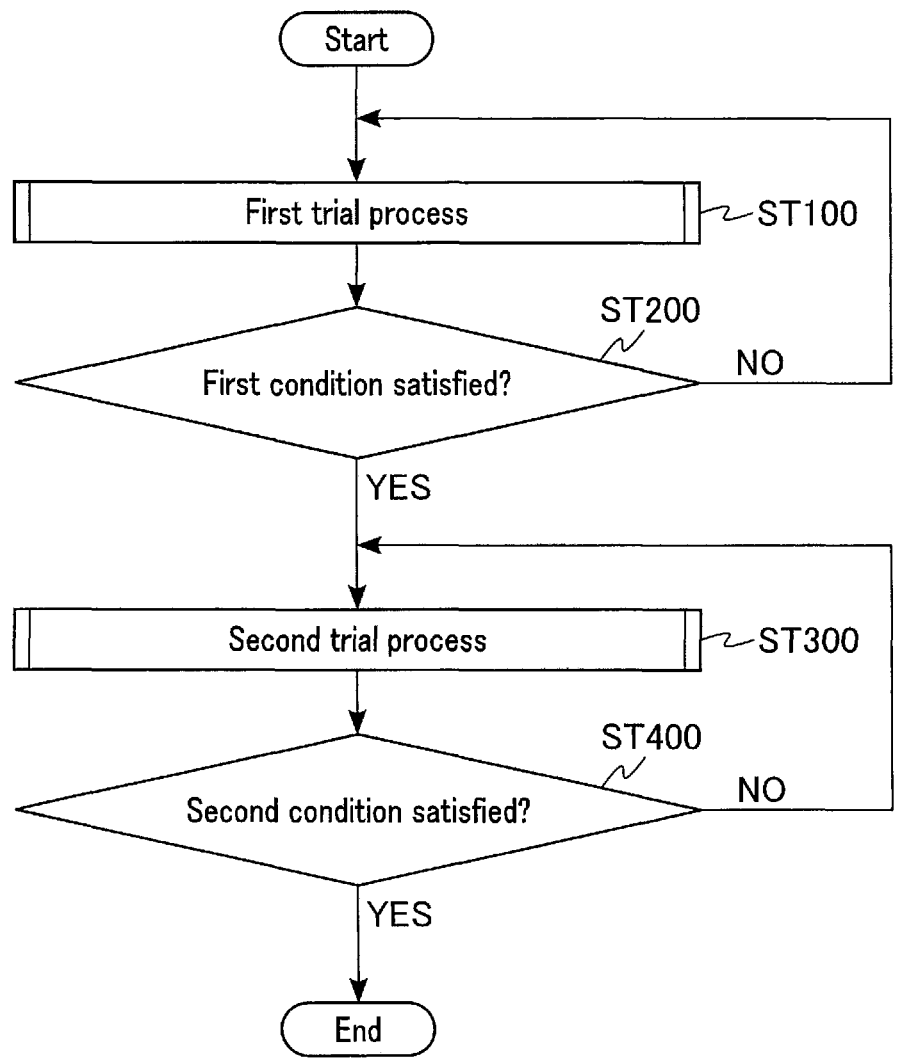
FIG. 17 is a flowchart illustrating an example of how a memory operation is performed in the memory device of the first embodiment.

FIG. 17 is a flowchart illustrating an example of how a memory operation is performed in the memory device 1 of the first embodiment. As illustrated in FIG. 17, the memory device 1 of the first embodiment can execute the processes of steps ST100, ST200, ST300 and ST400 in the memory operation. Hereinafter, details of how the memory operation is performed in the memory device 1 of the first embodiment will be described with reference to FIG. 17.

The control circuit 50 (trial control unit 52) starts the memory operation, for example, in response to a user's instruction (Start).

First, the control circuit 50 executes the first trial process (step ST100). In the first trial process, the control circuit 50 executes a penalty process or a reward process. Further, in the first trial process, the control circuit 50 records a reference value RV, acquired by the second read operation in which a plurality of reference cells are targeted, in the reference information RI.

Next, the control circuit 50 determines whether or not a first condition is satisfied (step ST200). The first condition is, for example, whether or not RVnow>RVbfr is satisfied after RVnow<RVbfr is satisfied in the reference information RI obtained from the results of the successive first trial processes. RVnow is a reference value RV recorded in the immediately preceding first trial process. RVbfr is a reference value RV recorded in the first trial process which is one process before the immediately preceding first trial process. That is, in step ST200, the control circuit 50 checks the two successive first trial processes and confirms whether the read current measured in the second read operation performed for a plurality of reference cells increases after it decreases.

If it is determined in step ST200 that the first condition is not satisfied (step ST200, NO), the control circuit 50 proceeds to the process of step ST100. That is, the control circuit 50 repeatedly executes the first trial process until the first condition is satisfied.

Where the first condition is satisfied in step ST200 (step ST200, YES), the control circuit 50 executes the second trial process (step ST300). In the second trial process, the control circuit 50 executes a penalty process or a reward process. Further, in the second trial process, the control circuit 50 records a reference value RV, acquired by the second read operation in which a plurality of reference cells are targeted, in the reference information RI.

Next, the control circuit 50 determines whether or not the second condition is satisfied (step ST400). The second condition corresponds to a termination condition of reinforcement learning. For example, the second condition is a condition in which the learning completion condition is satisfied in each state S. The condition for completing the learning is, for example, that the reward process is executed at least once in each state S. The termination condition of reinforcement learning may include a state S in which the reward process is not executed, and can be set as appropriate.

Where the second condition is not satisfied in step ST400 (step ST400, NO), the control circuit 50 proceeds to the process of step ST300. That is, the control circuit 50 repeatedly executes the second trial process until the second condition is satisfied.

Where the second condition is satisfied in step ST400 (step ST400, YES), the control circuit 50 ends the memory operation (End).

By the memory operation described above, the control circuit 50 controls the resistance values of the memory cells MC in the memory group MG1 such that a certain word line WL and a certain bit line BL are paired. The control circuit 50 controls the resistance value of the memory cell MC coupled between the paired word line WL and bit line BL such that the resistance value becomes lower than the resistance value of the memory cell MC coupled to that word line WL and coupled to a different bit line BL. Further, the control circuit 50 controls the resistance values of the memory cells MC (reference cells) in the memory group MG2, based on the reward process and the penalty process executed for the word line WL. Thus, the memory device 1 can associate one bit line BL (action A) belonging to the memory group MG1 with one word line WL (state S). In the description below, the memory cell MC coupled to the word line WL and the bit line BL that are associated by the memory operation will be referred to as an "optimal action memory cell MC".

The reference value RV, which is based on the resistance values of a plurality of reference cells, can change as the memory operation progresses. The determination of the first condition in step ST200 may be made by the method shown below. The control circuit 50 compares the reference values RVbfr and RVnow immediately after the start of the memory operation, and sets a flag when RVbfr>RVnow. The control circuit 50 compares RVbfr and RVnow each time the first trial process is repeated, lowers the flag when RVbfr<RVnow, and generates a control signal for switching the operation method of the penalty process. In other words, the control circuit 50 refers to the reference value RV changing in time series, generates a trigger for switching operations, based on the detection that the situation RVbfr>RVnow and the situation RVbfr<RVnow occur in order, and switches the trial process executed in the memory operation from the first trial process to the second trial process.

As a result, the memory device 1 of the first embodiment performs a second write operation in which a selected memory cell MC is targeted in the penalty processes from the first trial process to the m-th trial process (m is an integer of 2 or more), and the process for the non-selected memory cells MC is omitted. Thereafter, the memory device 1 executes a second write operation for the selected memory cell MC and a first write operation for the non-selected memory cell MC, as a penalty process in the (m+1)th and subsequent trial processes. In this case, "m" corresponds to the number of times the trial process is performed until the selected memory cell MC becomes correct for the first time after the memory device 1 starts the memory operation.

[1-3] Advantages of First Embodiment

The memory device 1 of the first embodiment described above can improve the reliability of data. Detailed advantages of the memory device 1 of the first embodiment will be described below.

It is considered that the memory cell array 10 having a cross-point structure can be utilized as a reinforcement learning system that can be used for robot control, image recognition, object detection, etc. In the memory cell array 10 having a cross-point structure, a select transistor is not provided for each memory cell MC, and a resistance change type memory cell MC is used. That is, in the memory cell array 10 having a cross-point structure, learned information is stored in association with the resistance value of the memory cell MC.

In the reinforcement learning using the memory cell array 10, each of a reward process and a penalty process is realized by applying a voltage to the memory cell MC. Each of the reward process and the penalty process includes, for example, a write operation in which a selected memory cell MC and a non-selected memory cell MC are targeted. In this case, each of the reward process and the penalty process is executed such that all bit lines BL in the memory cell array 10 are targeted in one trial process.

However, as the number of write operations increases, the memory cell MC is more likely to be damaged. If the memory cell MC is damaged in the memory cell array 10 having a cross-point structure, a large leakage current may flow through the damaged memory cell MC. Specifically, the read current of a damaged half-selected memory cell MC becomes significantly larger than the read current of a selected memory cell MC, and an accurate read result cannot be obtained. In order to avoid damage to the memory cell MC, it is preferable that the number of times the voltage is applied to the memory cell MC during learning is decreased and the stress on the memory cell MC is reduced, accordingly.

Therefore, the memory device 1 of the first embodiment changes the method of the penalty process according to the progress of learning in the memory operation (reinforcement learning). Specifically, in the penalty processes of the first to m-th trial processes, the memory device 1 executes a second write operation (a write operation that increases the resistance value) in which only the selected memory cell MC is targeted. Then, in the penalty processes of the (m+1)th and subsequent trial processes, the memory device 1 executes a second write operation in which the selected memory cell MC is targeted and a first write operation (a write operation that lowers the resistance value) in which the non-selected memory cell MC is targeted.

The memory device 1 of the first embodiment includes a memory group MG1 which stores a learning result and a memory group MG2 which includes a reference cell referred to in the memory operation. The reference cell is used as a trigger for switching the method of the penalty process. In each trial process, the memory device 1 executes a reward process or a penalty process not only for the selected memory cell MC but also for reference cells sharing the same state S. Thus, the sum of the currents read from the plurality of reference cells during learning changes in time series, depending on whether or not the action A is successful. The control circuit 50 determines whether or not the action A assigned to the selected memory cell MC succeeds for the first time by confirming the temporal change in the reference value RV acquired from the plurality of reference cells.

Specifically, where the action A fails, the second write operation is executed for the reference cells, and the resistance values of the reference cells increase. In this case, the present reference value RVnow becomes a value higher than the immediately preceding reference value RVbfr. On the other hand, where the action A is successful, the first write operation is executed for the reference cells, and the resistance values of the reference cells decrease. In this case, the present reference value RVnow is lower than the immediately preceding reference value RVbfr. In this manner, the control circuit 50 can determine whether or not the action A is successful, based on the temporal change in the reference value RV.

The memory device 1 of the first embodiment determines the switching timing of the penalty process, based on the timing at which the magnitude relation of the reference value RV is reversed. In the penalty processes in the early stage of reinforcement learning, the first write operation is not performed for the non-selected memory cells, but this has little effect on the learning performance, and the effect is almost negligible.

Therefore, the memory device 1 of the first embodiment can shorten the time required for reinforcement learning without substantially deteriorating the learning performance. Even where the action A is successful immediately after the memory operation, the memory operation of the memory device 1 of the first embodiment can exhibit the same performance as a comparative example of the first embodiment. Further, since the first write operation is not executed for the non-selected memory cells MC in the penalty process of the first trial process, the memory device 1 can reduce the stress on the non-selected memory cells MC. As a result, the memory device 1 of the first embodiment can improve the reliability of data.

[1-4] Modifications of First Embodiment

The memory device 1 of the first embodiment can be modified in various manners. For example, the first condition mentioned in FIG. 17 may be whether or not the number of times RVnow>RVbfr is satisfied is two or more times in a row. The first condition may be determined by using at least the relationship between RVnow and RVbfr. The memory device 1 can improve the learning accuracy as the number of times RVnow>RVbfr is satisfied in the first condition is set closer to one. That is, in the memory device 1 of the first embodiment, the first condition is preferably set such that whether or not the number of times RVnow>RVbfr is satisfied is one.

In the memory device 1 of the first embodiment, reference cells may be provided in a plurality of columns. In other words, a plurality of bit lines BL may be associated with the memory group MG2, and the memory group MG2 may include memory cells MC arranged in a plurality of columns. Where a plurality of reference cells are provided for one state S, part of the plurality of reference cells may be used as a redundant area, or the same operation as mentioned in the first embodiment may be executed for each of the plurality of reference cells. For example, the control circuit 50 can suppress variations in measurement results by averaging reference values RV acquired from the reference cells arranged in a plurality of columns, and can therefore improve the determination accuracy of the first condition.

The memory device 1 of the first embodiment may omit the processes of steps ST15 and ST16 in the second trial process where the operation related to the embodiment described later is not executed.

[2] Second Embodiment

The hardware configuration of the memory device 1 of the second embodiment is the same as that of the first embodiment. In the memory operation, the memory device 1 of the second embodiment omits the reward process and the penalty process for each of memory cells MC in the learned state S. A description will be given of the points in which the memory device 1 of the second embodiment differs from that of the first embodiment.

[2-1] Configuration of Control Circuit 50

Figure 18:
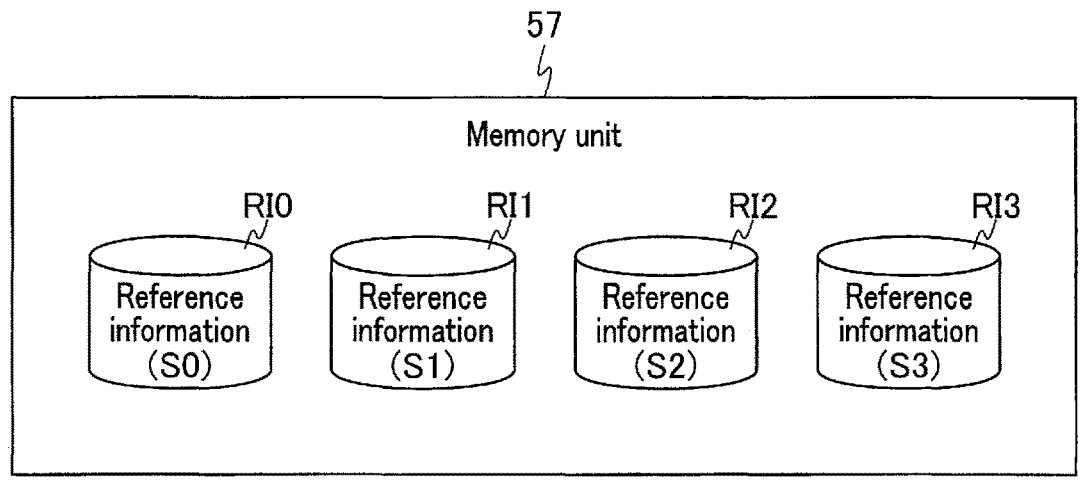
FIG. 18 is a schematic view illustrating an example of information stored in a memory unit of a memory device according to the second embodiment.

FIG. 18 is a schematic view illustrating an example of information stored in the memory unit 57 of the memory device 1 of the second embodiment. As illustrated in FIG. 18, the memory unit 57 of the second embodiment stores reference information RI0, RI1, RI2 and RI3. The reference information RI0, RI1, RI2 and RI3 are associated with states S0, S1, S2 and S3, respectively. Read results of the reference cells in the states S0, S1, S2 and S3 are recorded in the reference information RI0, RI1, RI2 and RI3, respectively. The reference information RI0, RI1, RI2 and RI3 may store learning states in the states S0, S1, S2 and S3, respectively. The reference information RI0, RI1, RI2 and RI3 may be used as counters. In other words, the control circuit 50 may have a counter for each state S. The other configurations of the memory device 1 of the second embodiment are similar to those of the first embodiment.

[2-2] Operation

The memory device 1 of the second embodiment can execute the third read operation under the control of the control circuit 50. Details of the third read operation and the memory operation performed in the second embodiment will be described below.

[2-2-1] Third Read Operation

Figure 19:
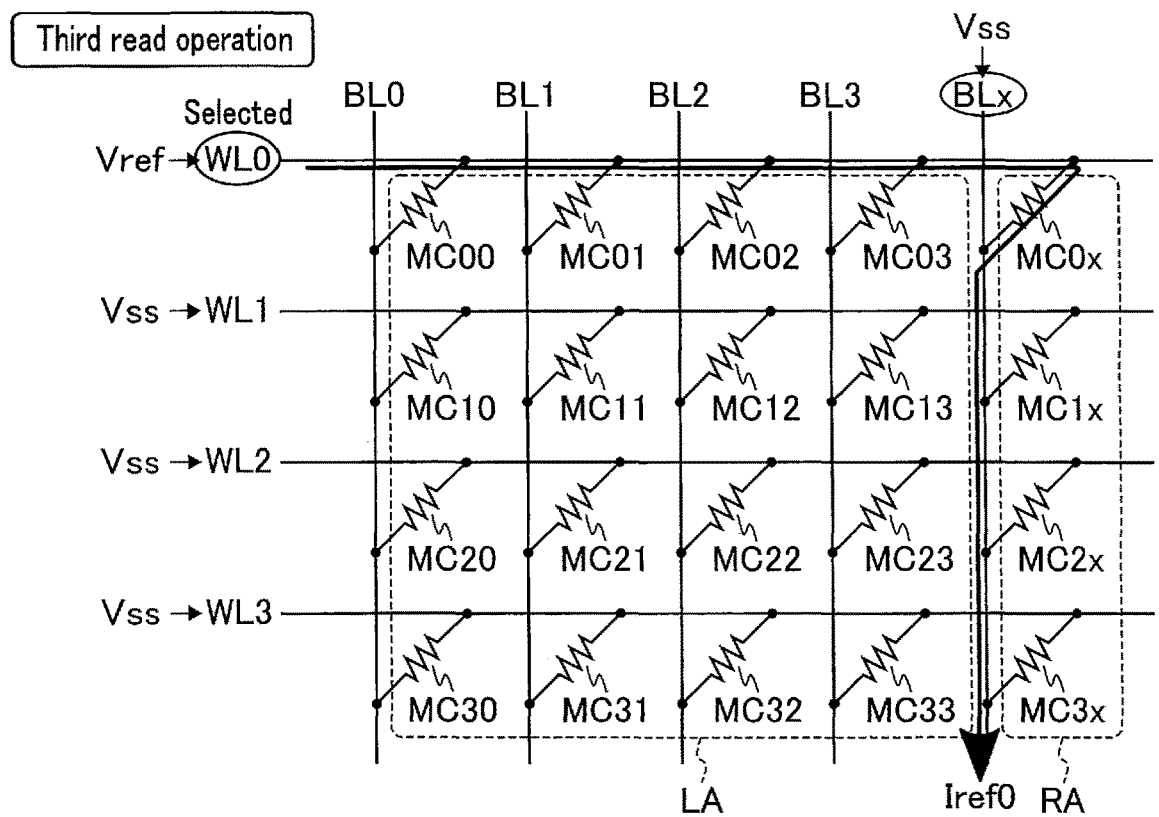
FIG. 19 is a schematic view illustrating an example of how a third read operation is performed in the memory device of the second embodiment.

FIG. 19 is a schematic view illustrating an example of how the third read operation is performed in the memory device 1 of the second embodiment, and shows voltages applied to respective interconnects at a certain point of time. As illustrated in FIG. 19, in the third read operation, the control circuit 50 executes a read operation in which one word line WL and one bit line BL are selected. The third read operation will be described, referring to the case where the word line WL0 and the bit line BLx are selected.

Vref is applied to the selected word line WL0. Vss is applied to each of the non-selected word lines WL1 to WL3. Vss is applied to the selected bit line BLx. For example, no voltage is applied to the non-selected bit lines BL, or Vref/2 is applied thereto.

As described above, in the third read operation, a forward voltage is applied to each of the selected memory cell MC and the half-selected memory cell MC. The voltage difference across the selected memory cell MC is greater than the voltage difference across the half-selected memory cell MC. The voltage difference across the selected memory cell MC is, for example, equal to or greater than the threshold voltage of the memory cell MC that stores "0" data. The voltage difference across the half-selected memory cell MC is lower than, for example, the threshold voltage of the memory cell MC that stores "0" data. A substantially same voltage is applied across the non-selected memory cell MC, and the voltage difference across the non-selected memory cell MC is thus suppressed.

As a result, a current can flow from the selected word line WL0 via the selected memory cell MC0x. The read current Iref0 flowing through the selected bit line BLx via the selected memory cell MC0x is supplied to the measurement circuit 44 in the read circuit 40. In the half-selected memory cells MC1x, MC2x and MC3x, a read current is suppressed, and the disturbance with respect to the half-selected memory cells MC, MC2x and MC3x is thus suppressed.

In the third read operation performed in the second embodiment, the measurement circuit 44 in the read circuit 40 measures a current flowing through one selected memory cell MC (reference cell) associated with the memory group MG2, and the control circuit 50 is notified of this measurement result.

[2-2-2] Memory Operation

The memory operation of the second embodiment includes a third trial process. Details of the third trial process and the memory operation of the second embodiment will be described below.

(Third Trial Process)

Figure 20:
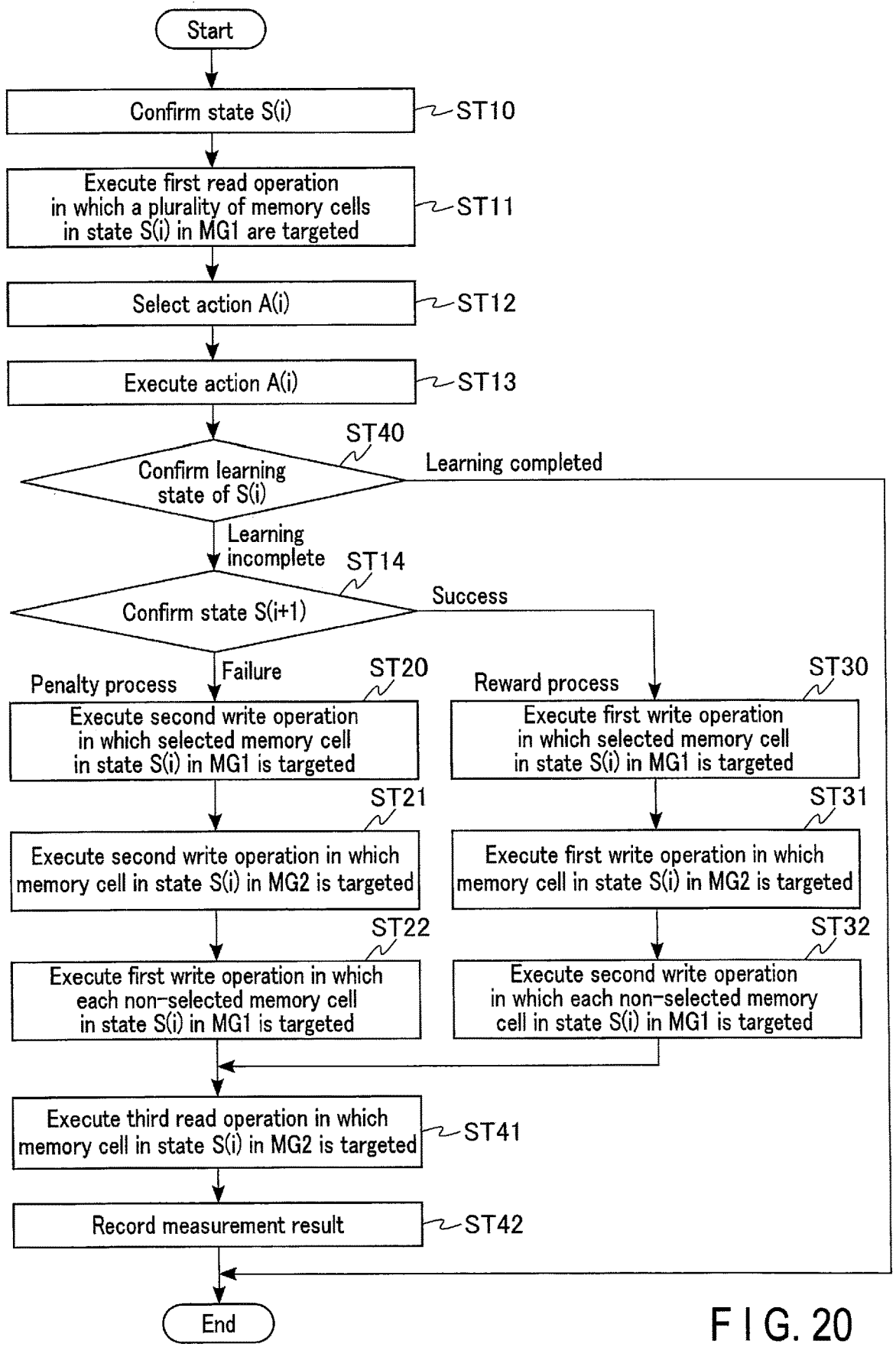
FIG. 20 is a flowchart illustrating an example of how a third trial process is performed in the memory device of the second embodiment.

FIG. 20 is a flowchart illustrating an example of how a third trial process is performed in the memory device 1 of the second embodiment. As illustrated in FIG. 20, the memory device 1 can execute the processes of steps ST10 to ST14, ST20 to ST22, ST30 to ST32 and ST40 to ST42 in the third trial process. Details of the third trial process will be described below.

The control circuit 50 (the trial control unit 52) starts the third trial process, according to the flow of the memory operation performed in the memory device 1 of the second embodiment described later (Start).

First, the control circuit 50 sequentially executes the processes of steps ST10 to ST13 in the same manner as in the first trial process. When the process of step ST13 is completed, the control circuit 50 confirms the learning state of the state S(i) (step ST40). Specifically, the control circuit 50 refers to the reference information RIi of the memory unit 57 and determines whether or not the learning of the state S(i) selected in step ST10 is completed.

Where the learning is completed (step ST40, learning completed), the control circuit 50 ends the third trial process (End).

Where the learning is not completed (step ST40, learning incomplete), the control circuit 50 executes the process of step ST14 as in the first embodiment. Then, the control circuit 50 executes a penalty process or a reward process, based on the result of step ST14.

In the penalty process (step ST14, failure) of the third trial process, the control circuit 50 sequentially executes the processes of steps ST20, ST21 and ST22.

In the reward process (step ST14, success) of the third trial process, the control circuit 50 sequentially executes the processes of steps ST30, ST31 and ST32, as in the first trial process.

After the penalty process or the reward process, the control circuit 50 executes a third read operation in which a memory cell MC (reference cell) in the state S(i) in the memory group MG2 is targeted (step ST41). In the process of step ST41, the measurement circuit 44 of the read circuit 40 measures a read current (reference value RV) flowing through the memory cell MC (reference cell) coupled to the word line WL to which the state S(i) is assigned and coupled to the bit line BLx is measured. In other words, in the process of step ST41, the read current flowing through the reference cell corresponding to the selected state S is measured.

Next, the control circuit 50 records the measurement result (step ST42). Specifically, the memory unit 57 of the control circuit 50 records the reference value RV measured by the process of step ST41 in the reference information RIi associated with the state S(i). Then, the control circuit 50 ends the third trial process (End).

In step ST40 of the third trial process described above, the control circuit 50 is only required to confirm the learning state, based on the reference information RIi. For example, where the control circuit 50 detects that RVnow>RVbfr is satisfied twice in a row in the reference information RIi, it is determined that the learning of the state S(i) is completed. In other words, where the control circuit 50 refers to the latest three reference values RV included in the reference information RTi and detects that the reference value RV increases twice in a row, it is determined that the learning of the state S(i) is completed. That is, it is determined that the state S(i) has been learned.

The process of step ST40 may be replaced with another method. For example, the control circuit 50 obtains time-series reference values RV by the second read operation performed for the memory group MG2. Where the control circuit 50 detects RVbfr<RVnow when the reference value RV is recorded, the control circuit 50 adds "1" to the counter of the reference information RIi. On the other hand, where the control circuit 50 detects RVbfr>RVnow when the reference value RV is recorded, the control circuit 50 returns the counter of the reference information RIi to "0". When the counter of the reference information RIi becomes 2 or more after the repetition of the third trial process, the control circuit 50 determines that the learning of the state S associated with the reference information RIi is completed. After the learning is completed, the control circuit 50 omits the reward process and the penalty process in which the learning-completed state Si is selected.

(Details of Memory Operation)

Figure 21:
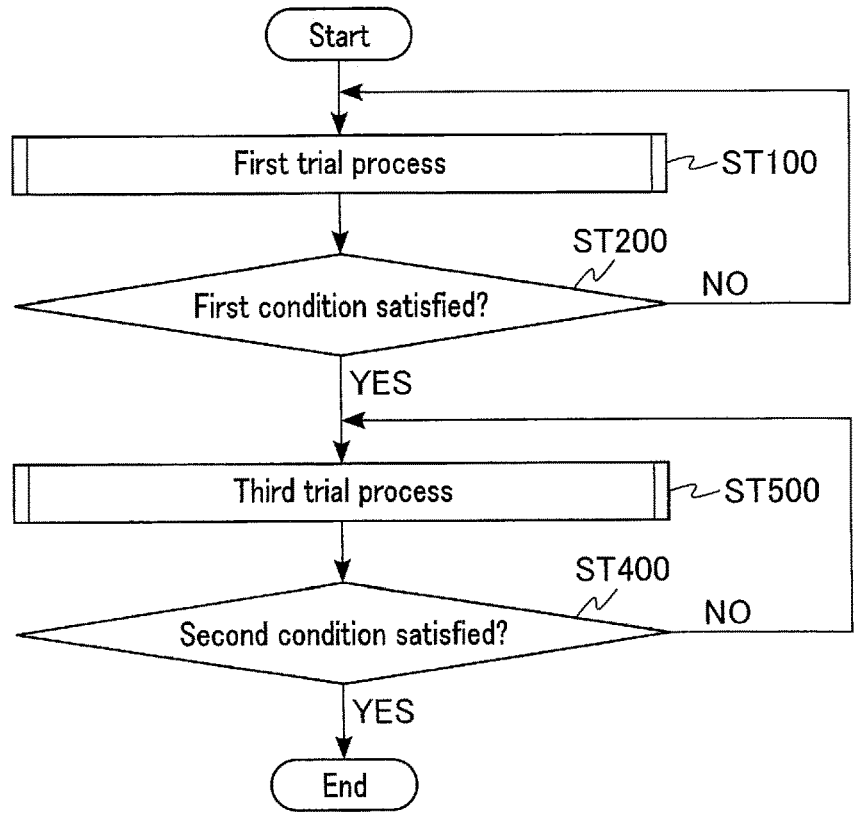
FIG. 21 is a flowchart illustrating an example of how a memory operation is performed in the memory device of the second embodiment.

FIG. 21 is a flowchart illustrating an example of how a memory operation is performed in the memory device 1 of the second embodiment. As illustrated in FIG. 21, the memory operation of the memory device 1 of the second embodiment is similar to the memory operation described in connection with the first embodiment with reference to FIG. 17, except that step ST300 is replaced with step ST500.

Specifically, the control circuit 50 (trial control unit 52) executes the process of step ST500 where the first condition is satisfied in step ST200. In the process of step ST500, the memory device 1 executes a third trial process. In the third trial process, the control circuit 50 executes a penalty process or a reward process in accordance with the learning state. After the third trial process is completed, the memory device 1 executes the process of step ST400.

Where the second condition is not satisfied in step ST400 (step ST400, NO), the control circuit 50 proceeds to the process of step ST500. That is, the control circuit 50 repeatedly executes the third trial process until the second condition is satisfied.

Where the second condition is satisfied in step ST400 (step ST400, YES), the control circuit 50 ends the memory operation (End). Other operations of the memory device 1 of the second embodiment are similar to those of the first embodiment.

In the memory operation of the second embodiment, the processes of steps ST100 and ST200 may be omitted. In this case, the reinforcement learning proceeds by repeating the third trial process.

[2-3] Advantages of Second Embodiment

As described above, the memory device 1 of the second embodiment monitors the states of the reference cells for each state S, and detects that the reward process is performed a plurality of times in a row for each state S. For example, the memory device 1 determines that the state S for which the reward process has been executed twice in a row is a learned state, and in the subsequent trial processes, the reward process and penalty process in which the memory cell MC in the learned state S is targeted are omitted.

As a result, the memory device 1 of the second embodiment can suppress the stress on the memory cell MC due to execution of the write operation after the learning is completed. Therefore, the memory device 1 of the second embodiment can suppress the risk of damage to the memory cell MC as compared with the first embodiment, and can therefore improve the reliability of the data.

[2-4] Modification of Second Embodiment

The memory device 1 of the second embodiment can be modified in various manners. For example, the condition for completing learning mentioned in FIG. 20 may be whether or not the number of times RVnow>RVbfr is satisfied is three or more times in a row. The memory device 1 can improve the learning accuracy as the number of times RVnow>RVbfr is satisfied in a row is set to be a larger value in the determination of learning completion. On the other hand, in the memory device 1, the smaller the number of times is, the shorter the time of the memory operation. As described above, the memory device 1 of the second embodiment can adjust the balance between time and accuracy in reinforcement learning by appropriately setting the memory completion condition.

[3] Third Embodiment

The memory device 1 of the third embodiment executes an operation for guaranteeing data (learning result) stored in the memory group MG1 after the memory operation is completed. A description will be given of the points in which the memory device 1 of the third embodiment differs from those of the first and second embodiments.

[3-1] Configuration

[3-1-1] Configuration of Memory Cell Array 10

Figure 22:
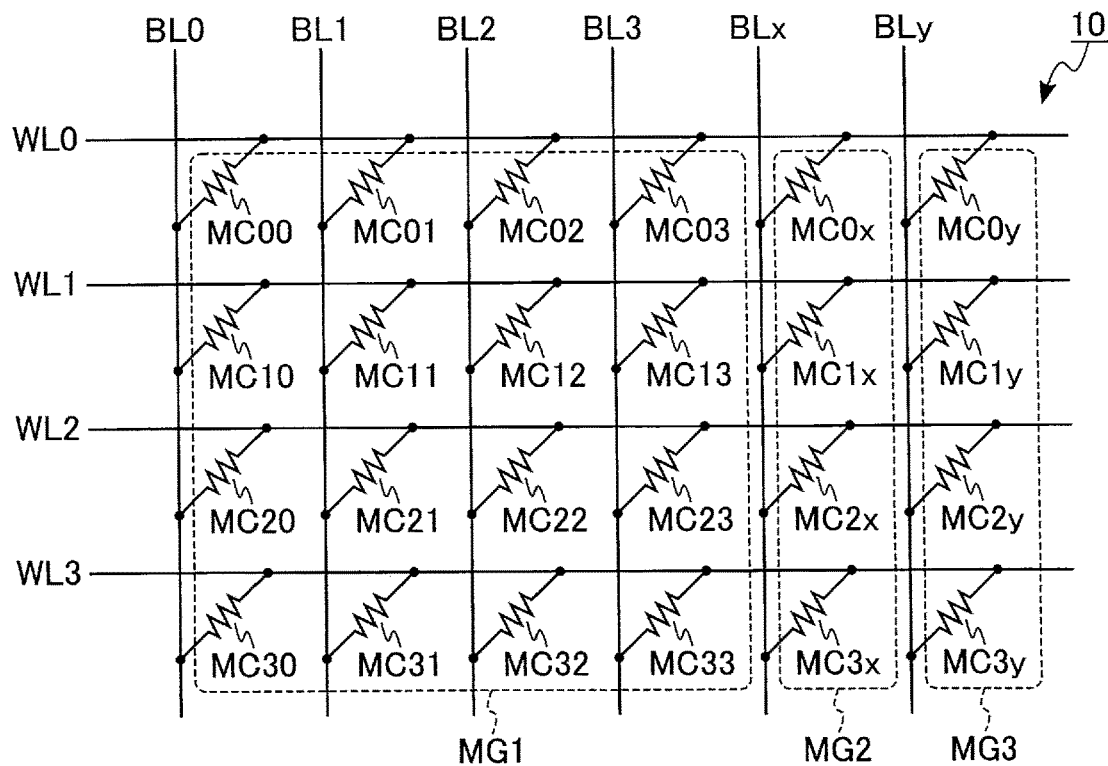
FIG. 22 is a circuit diagram illustrating an example of a circuit configuration of a memory cell array provided in a memory device according to the third embodiment.

FIG. 22 is a circuit diagram illustrating an example of a circuit configuration of the memory cell array 10 provided in the memory device 1 of the third embodiment. As illustrated in FIG. 22, the memory cell array 10 of the third embodiment is similar to the memory cell array 10 described in connection with the first embodiment with reference to FIG. 2, except that memory cells MC0y, MC1y, MC2y and MC3y and a bit line BLy are added.

Specifically, the memory cell MC0y is coupled between the word line WL0 and the bit line BLy. The memory cell MC1y is coupled between the word line WL1 and the bit line BLy. The memory cell MC2y is coupled between the word line WL2 and the bit line BLy. The memory cell MC2y is coupled between the word line WL0 and the bit line BLy.

In the memory device 1 of the third embodiment, the plurality of memory cells MC are classified into three memory groups MG. A memory group MG1 includes memory cells MC coupled to one of the bit lines BL0 to BL3. A memory group MG2 includes memory cells MC coupled to the bit line BLx. A memory group MG3 includes memory cells MC coupled to the bit line BLy. The roles of the memory groups MG1 and MG2 are the same as those in the first embodiment. The memory group MG3 stores information regarding a refresh operation. The memory cell MC coupled to the bit line BLy may be referred to as a flag cell.

[3-1-2] Configuration of Control Circuit 50

FIG. 23 is a block diagram illustrating an example of the functional configuration of a control circuit 50 provided in the memory device 1 of the third embodiment. As illustrated in FIG. 23, the control circuit 50 includes, for example, a timer 80, a refresh control unit 81, a counter 82, a first driver control unit 53, a second driver control unit 54, a read control unit 55 and a memory unit 57. Each functional configuration of the control circuit 50 of the third embodiment is realized, for example, by a CPU, a RAM or the like included in the control circuit 50.

The timer 80 indicates the current time. The time information generated by the timer 80 is referred to by the refresh control unit 81. This time information can be used as a trigger for executing various operations by the control circuit 50. The refresh control unit 81 can control the first driver control unit 53, the second driver control unit 54 and the read control unit 55 to execute the read operation and the write operation. Further, the refresh control unit 81 can execute a deterioration confirmation operation and a refresh operation, which will be described later, based on a predetermined condition. The predetermined condition is based on, for example, reference information RI stored in the memory unit 57. Details of the predetermined condition will be described later. The counter 82 is used by the refresh control unit 81. Other configurations of the memory device 1 of the third embodiment are similar to those of the first embodiment.

[3-2] Operation

The memory device 1 of the third embodiment can execute the third write operation under the control of the control circuit 50. Further, the memory device 1 of the third embodiment executes a memory completion operation when a memory operation (that is, reinforcement learning) is completed. Still further, the memory device 1 of the third embodiment executes, for example, a deterioration confirmation operation periodically after the memory completion operation is completed, and executes a refresh operation based on the result of the deterioration confirmation operation. Details of each of the third read operation, the memory completion operation, the deterioration confirmation operation and the refresh operation will be described below.

[3-2-1] Third Write Operation

FIG. 24 is a schematic view illustrating an example of how a third write operation is performed in the memory device 1 of the third embodiment. As illustrated in FIG. 24, the memory device 1 repeatedly executes a program loop in the third write operation. The write operation performed in this example includes N program loops (N is an integer of 1 or more). The number of program loops can be varied, depending on the state of the memory cell transistor MT. The program loop includes a program operation ("Program") and a verify operation ("Verify").

The program operation is an operation of lowering the resistance value of a selected memory cell MC. In the program operation, the control circuit 50 applies a voltage to each word line WL and each bit line BL in the same manner as in the first write operation. For example, in the program operation, a write voltage Vset is applied to the selected word line WL.

As a result, the amount of polarization of the selected memory cell MC changes, and the resistance value of the selected memory cell MC decreases. In the third write operation, the write voltage Vset is stepped up each time the program loop is repeated. In other words, the write voltage Vset applied to the selected word line WL is set such that it increases in accordance with an increase in the number of program loops executed.

The verify operation is an operation for confirming the write state of the selected memory cell MC. In the verify operation, the control circuit 50 executes a third read operation using a verify voltage Vvfy, for the same selected memory cell MC for which the program operation of the program loop is executed. Where "1" data is read from the selected memory cell MC by the third read operation, that is, where the threshold voltage of the selected memory cell MC is equal to or lower than the verify voltage Vvfy, the control circuit 50 determines a verify fail and executes the next program loop. On the other hand, where "0" data is read from the selected memory cell MC by the third read operation, that is, where the threshold voltage of the selected memory cell MC exceeds the verify voltage Vvfy, the control circuit 50 determines a verify pass and ends the third write operation.

[3-2-2] Memory Completion Operation

Figure 25:
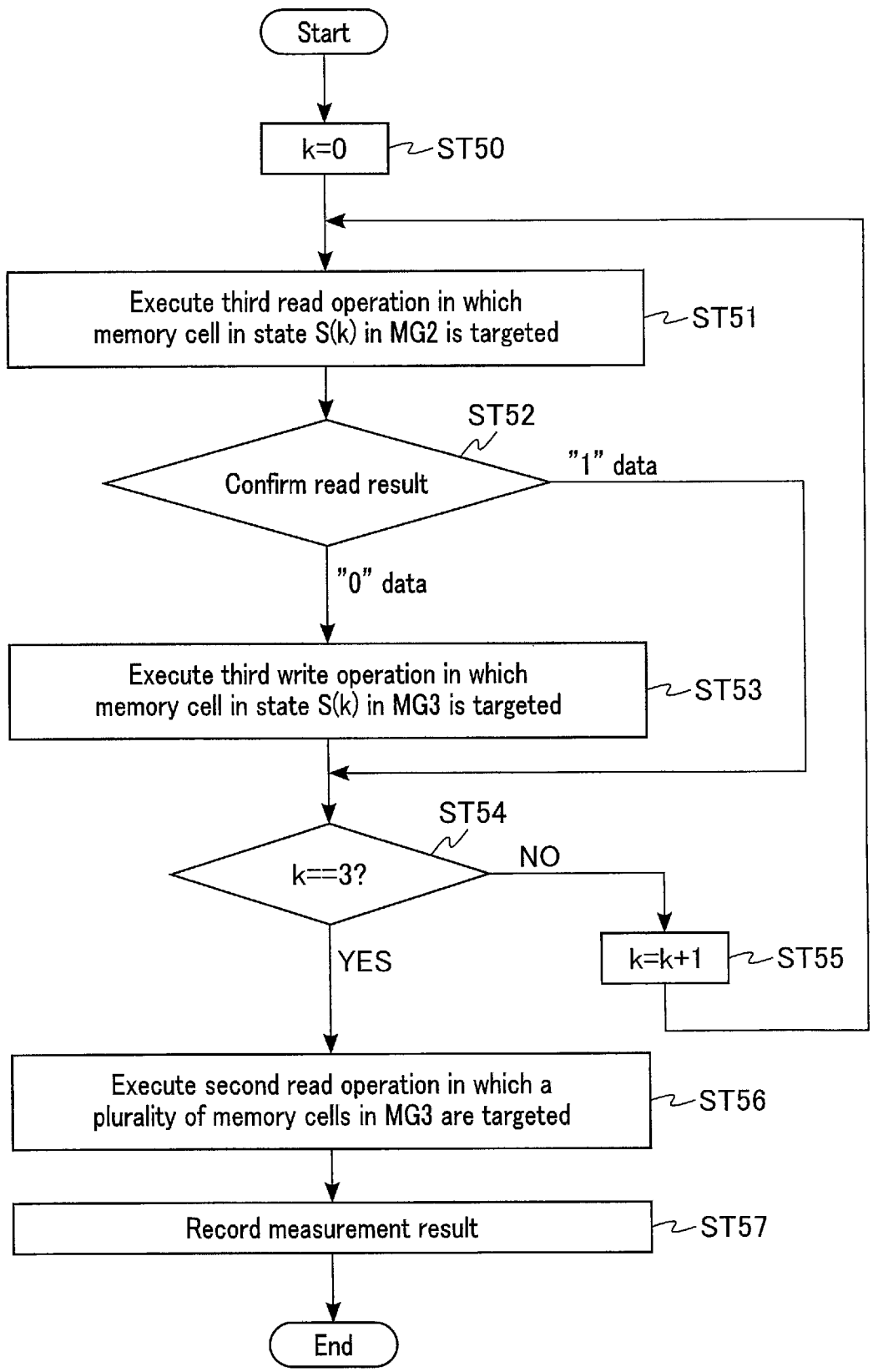
FIG. 25 is a flowchart illustrating an example of how a memory completion operation is performed in the memory device of the third embodiment.

FIG. 25 is a flowchart illustrating an example of how a memory completion operation is performed in the memory device 1 of the third embodiment. As illustrated in FIG. 25, the memory device 1 can execute the processes of steps ST50 to ST57 in the memory completion operation. Details of the memory completion operation will be described below.

The control circuit 50 (refresh control unit 81) starts the memory completion operation when the memory operation described in connection with the first embodiment or the second embodiment is completed (Start).

First, the control circuit 50 resets the counter 82 (step ST50, k=0). "k" indicates a numerical value held by the counter 82.

Next, the control circuit 50 executes a third read operation in which a memory cell MC in the state S(k) in the memory group MG2 is targeted (step ST51).

Next, the control circuit 50 confirms the read result of step ST51 (step ST52). In this example, "0" data is read where the reference cell is in the low resistance state, and "1" data is read where the reference cell is in the high resistance state. The "0" data stored in the reference cell indicates that the state S(k) assigned to the reference cell has been learned. The "1" data stored in the reference cell indicates that there is no learned data in the state S(k) assigned to the reference cell.

Where "0" data is confirmed in the process of step ST52 (step ST40, learning completed), the control circuit 50 executes a third write operation in which the memory cell MC (flag cell) in the state S(k) in the memory group MG3 is targeted (step ST53). In the process of step ST53, data (flag) indicating that the learned data exists in the state S(k) is written to the memory cell MC (flag cell) in the state S(k) by the write operation including the verify operation. When the process of step ST53 is completed, the control circuit 50 proceeds to the process of step ST54.

Where "1" data is confirmed in the process of step ST52 (step ST40, learning incomplete), the control circuit 50 proceeds to the process of step ST54.

In the process of step ST54, the control circuit 50 determines whether or not the value of the counter 82 is "3" (step ST54, k=3). The numerical value "3" used for comparison with the numerical value of the counter 82 in step ST53 can be appropriately changed according to the number of word lines WL to which the state S is assigned.

Where k=3 is not the case (step ST54, NO), the control circuit 50 increments the counter 82 (step ST55, k=k+1). That is, the control circuit 50 adds "1" to the numerical value "k" of the counter 82. The control circuit 50 proceeds to the process of step ST51 after the process of step ST55. That is, the control circuit 50 executes each of the processes of steps ST51 to ST53 for different states S, until the condition of step ST54 is satisfied.

Where k=3 is the case (step ST54, YES), the control circuit 50 executes a second read operation in which a plurality of memory cells MC (flag cells) in the memory group MG3 are targeted (step ST56). In the process of step ST56, the measurement circuit 44 of the read circuit 40 measures the total value (reference value RVinit immediately after learning) of the read currents flowing through the plurality of memory cells MC coupled to the bit line BLy. In other words, in the process of step ST56, the sum of the read currents flowing through all flag cells is read and measured.

Next, the control circuit 50 records the measurement result (step ST57). Specifically, the memory unit 57 of the control circuit 50 records the reference value RVinit measured by the process of step ST56 in the reference information RI. Thereafter, the control circuit 50 ends the memory completion operation (End).

[3-2-3] Deterioration Confirmation Operation

Figure 26:
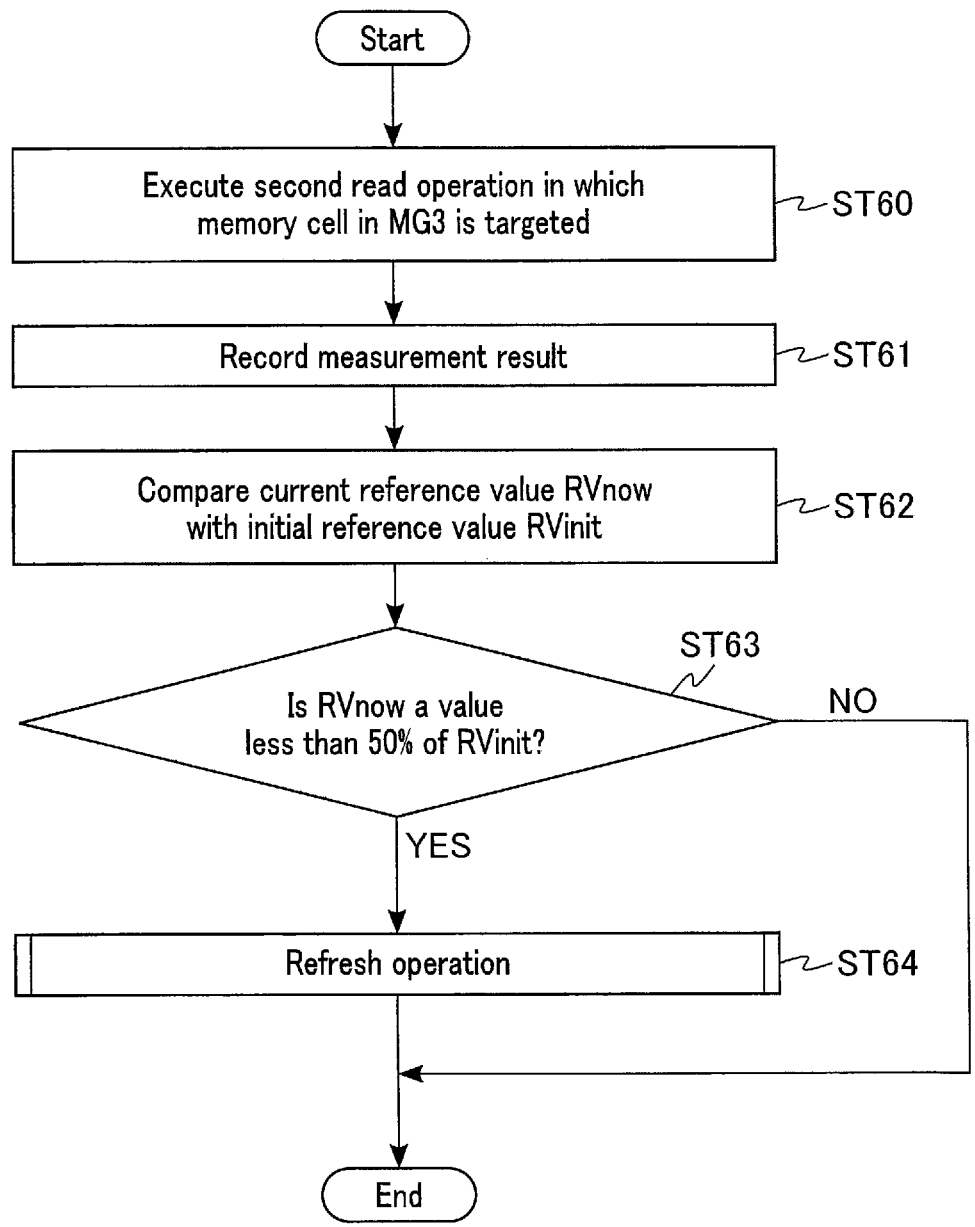
FIG. 26 is a flowchart illustrating an example of how a deterioration confirmation operation is performed in the memory device of the third embodiment.

FIG. 26 is a flowchart illustrating an example of how a deterioration confirmation operation is performed in the memory device 1 of the third embodiment. As illustrated in FIG. 26, the memory device 1 can execute the processes of steps ST60 to ST64 in the deterioration confirmation operation. Details of the deterioration confirmation operation will be described below.

The control circuit 50 (refresh control unit 81) periodically starts the deterioration confirmation operation by referring to the timer 80, for example (Start). The deterioration confirmation operation may be executed based on a user's instruction, or may be executed based on other conditions.

First, the control circuit 50 executes a second read operation in which a memory cell MC (flag cell) in the memory group MG3 is targeted (step ST60). In the process of step ST60, the measurement circuit 44 of the read circuit 40 measures the total value (reference value RVnow) of the read currents flowing through the plurality of memory cells MC coupled to the bit line BLy. In other words, in the process of step ST60, for example, the sum of the read currents flowing through all flag cells is read and measured.

Next, the control circuit 50 records the measurement result (step ST61). Specifically, the memory unit 57 of the control circuit 50 records the reference value RVnow measured by the process of step ST60 in the reference information RI.

Next, the control circuit 50 compares the current reference value RVnow with the reference value RVinit obtained immediately after learning (step ST62). Thus, the control circuit 50 can grasp a deterioration state of the plurality of memory cells MC in the memory group MG3.

Next, the control circuit 50 determines whether or not RVnow is a value less than 50% of RVinit (step ST63). The "50%" used for the determination in step ST63 can be appropriately changed, for example, in accordance with how the data reliability should be.

Where RVnow is a value less than 50% of RVinit (step ST63, YES), the control circuit 50 executes a refresh operation described later (step ST64). When the refresh operation is completed, the control circuit 50 ends the deterioration confirmation operation (End).

Where RVnow is a value of 50% of RVinit or more (step ST63, NO), the control circuit 50 ends the deterioration confirmation operation (End).

[3-2-4] Refresh Operation

Figure 27:
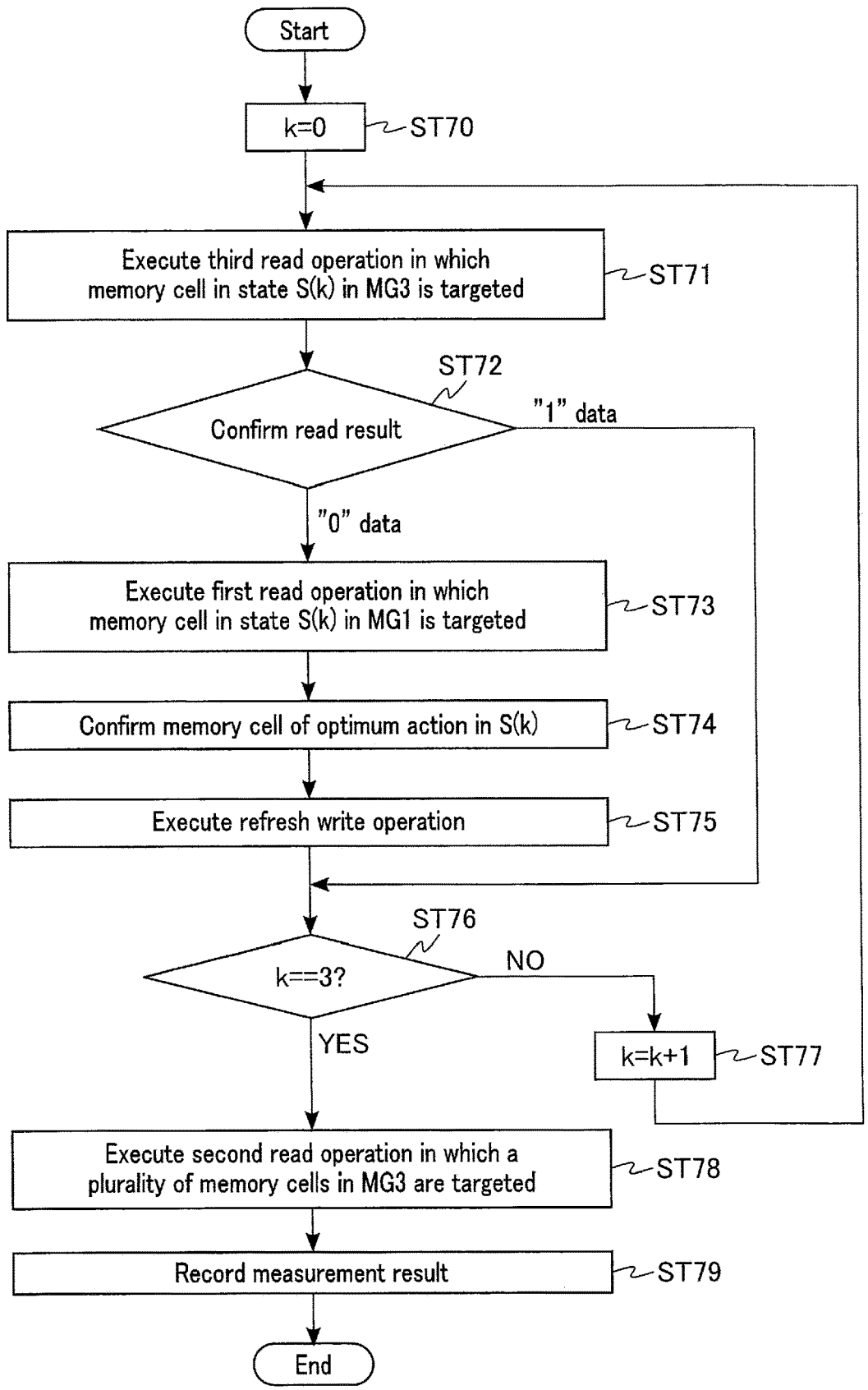
FIG. 27 is a flowchart illustrating an example of how a refresh operation is performed in the memory device of the third embodiment.

FIG. 27 is a flowchart illustrating an example of how a refresh operation is performed in the memory device 1 of the third embodiment. As illustrated in FIG. 27, the memory device 1 can execute the processes of steps ST70 to ST77 in the refresh operation. Details of the refresh operation will be described below.

The control circuit 50 (refresh control unit 81) starts the refresh operation in the process of step ST64, as described with reference to FIG. 26 (Start).

First, the control circuit 50 resets the counter 82 (step ST70, k=0). "k" indicates a numerical value held by the counter 82.

Next, the control circuit 50 executes a third read operation in which a memory cell MC (flag cell) in the state S(k) in the memory group MG3 is targeted (step ST71).

Next, the control circuit 50 confirms the read result of step ST71 (step ST72). In this example, "0" data is read where the flag cell is in the low resistance state, and "1" data is read where the flag cell is in the high resistance state.

The "0" data stored in the flag cell indicates that the state S(k) assigned to the flag cell has been learned. The "1" data stored in the flag cell indicates that there is no learned data in the state S(k) assigned to the flag cell.

Where "0" data is confirmed in the process of step ST72 (step ST72, "0" data), the control circuit 50 executes a first read operation in which the memory cell MC in the state S(k) in the memory group MG1 is targeted (step ST73).

Then, the control circuit 50 confirms a memory cell MC of an optimum action in the state S(k), based on the result of the first read operation in step ST73 (step ST74). The memory cell MC of the optimum action corresponds to the memory cell MC coupled to the bit line BL having the largest current amount and detected by the comparison circuit 43 in the first read operation.

Next, the control circuit 50 executes a refresh write operation in which the memory cell MC in the state S(k) in the memory group MG1 is targeted (step ST75). The refresh write operation includes a first write operation which is to be performed for the memory cell MC of the optimum action in the state S(k) confirmed in step ST74, and also includes a third write operation which is to be performed for the flag cell in the state S(k). In the refresh write operation, the third write operation may be executed for the memory cell MC of the optimum action in the state S(k); alternatively, the second write operation may be performed for a memory cell MC other than the memory cell MC of the optimum action. When the process of step ST75 is completed, the control circuit 50 proceeds to the process of step ST76.

Where "1" data is confirmed in the process of step ST72 (step ST72, "1" data), the control circuit 50 proceeds to the process of step ST76.

In the process of step ST76, the control circuit 50 determines whether or not the value of the counter 82 is "3" (step ST76, k=3). The numerical value "3" used for comparison with the numerical value of the counter 82 in step ST75 can be appropriately changed according to the number of word lines WL to which the state S is assigned.

If k=3 is not the case (step ST76, NO), the control circuit 50 increments the counter 82 (step ST77, k=k+1). That is, the control circuit 50 adds "1" to the numerical value "k" of the counter 82. The control circuit 50 proceeds to the process of step ST71 after the process of step ST77. That is, the control circuit 50 properly executes each of the processes of steps ST71 to ST75 for different states 5, until the condition of step ST76 is satisfied.

Where k=3 is the case (step ST77, YES), the control circuit 50 executes a second read operation in which a plurality of memory cells MC (flag cells) in the memory group MG3 are targeted (step ST78). In the process of step ST78, the measurement circuit 44 of the read circuit 40 measures the total value (reference value RVinit) of the read currents flowing through the plurality of memory cells MC coupled to the bit line BLy.

Next, the control circuit 50 records the measurement result (step ST79). Specifically, the memory unit 57 of the control circuit 50 records the reference value RVinit measured by the process of step ST78 in the reference information RI. Thus, the reference value RVinit is updated to the value changed by the refresh write operation. Thereafter, the control circuit 50 ends the memory completion operation (End).

As described above, the memory device 1 of the third embodiment stores the reference value RV in the memory unit 57 in the deterioration confirmation operation by periodically executing the second read operation in which the plurality of flag cells are targeted. Then, the memory device 1 executes the refresh operation, based on a change in the reference value RV. The refresh operation includes a write operation of lowering the resistance value of the memory cell MC which is included among the plurality of memory cells MC sharing the word line WL in the memory group MG1 and which has the lowest resistance value.

[3-3] Simulation Result

Figure 28:
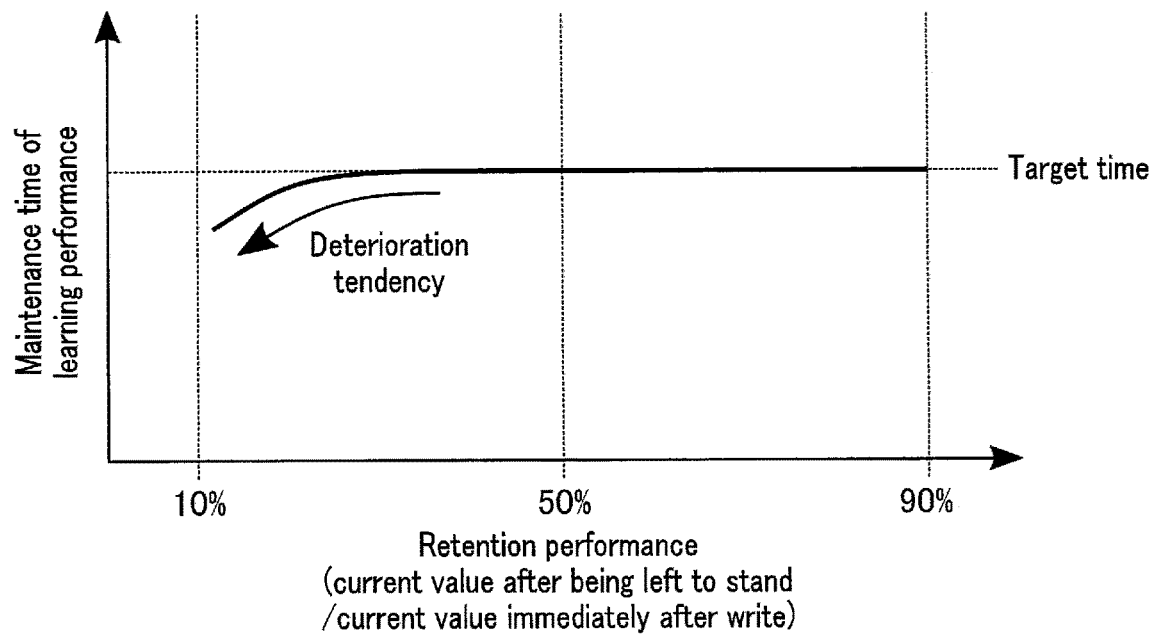
FIG. 28 is a graph illustrating an example of how retention performance and a maintenance time of learning performance are related in the memory device of the third embodiment.

FIG. 28 is a graph illustrating an example of how retention performance and the maintenance time of learning performance are related in the memory device 1 of the third embodiment. The vertical axis of FIG. 28 shows the maintenance time of the learning performance. It is preferable that the maintenance time of the learning performance reaches a target time. If the maintenance time of the learning performance does not reach the target time, this indicates that a learning result is not in the ideal state. The horizontal axis of FIG. 28 shows retention performance of data. The retention performance indicates (current value after being left to stand/current value immediately after write) of the memory device 1. The current value which the memory device 1 has after being left to stand corresponds to the reference value RVnow. The current value immediately after write corresponds to the reference value RVinit.

As illustrated in FIG. 28, where the retention performance is 50% to 90%, the maintenance time of learning performance achieves the target time. On the other hand, as the retention performance decreases and is lower than, for example, 50%, the maintenance time of the learning performance tends to decrease (deterioration tendency). Therefore, the determination condition in the process of step ST63 illustrated in FIG. 26 is preferably "RVnow is a value less than 50% of RVinit". Thus, the memory device 1 of the third embodiment can maintain the target learning performance. It should be noted that this determination condition can be appropriately changed depending on the characteristics of the memory cell MC and the required reliability performance.

[3-4] Advantages of Third Embodiment

The resistance value which the memory cell MC has after the execution of a memory operation varies in the memory cell array 10. Further, since the first write operation and the second write operation, which are executed in the memory operation, do not include a verify operation, a plurality of memory cells MC in the learned state S have problems in that the margin of the on/off ratio may be small between a memory cell MC of an optimum action and the other memory cells MC. Where the margin of the on/off ratio in each state S is small, the influence of the retention and noise becomes large. For example, due to the influence of the retention and noise, the difference between the maximum value of the on-current of a selected memory cell MC and the maximum value of the off-current of a non-selected memory cell MC becomes small, and a bit line BL of the optimum action may not be selected easily.

Therefore, the memory device 1 of the third embodiment has a memory group MG3 that includes a flag cell for each state S. The flag cell indicates whether or not the associated state S contains learned data. Since data is written to the flag cell by the third write operation, the flag cell is in a low resistance state in which the margin of the on/off ratio is sufficiently secured. That is, the retention performance of the flag cell is higher than that of the memory cell MC of the memory group MG1.

The memory device 1 of the third embodiment executes a second read operation for a plurality of flag cells in the same manner as for the reference cell described in connection with the first embodiment, and a change in the reference value RV acquired from the memory group MG3 (a degradation state of the memory cell MC) is monitored. The memory device 1 executes a refresh operation, based on the fact that the current reference value RVnow is reduced to be less than a predetermined value (for example, 50%) from the initial reference value RVinit. The refresh operation includes a refresh write operation in which the memory cell MC of the optimum action is targeted.

In the refresh write operation, the memory device 1 appropriately executes a write operation such that the resistance state of the memory cell MC of the optimum action in the memory group MG1 is in a desired state (that is, a low resistance state). After the refresh write operation is executed, in the first read operation for the memory group MG1, the read current of the memory cell MC of the optimum action is conspicuous with respect to the read currents of the memory cells MC other than the memory cell MC of the optimum action.

As a result, the memory device 1 of the third embodiment can improve the selection accuracy of the bit line BL, that is, the selection accuracy of the action A, and can therefore improve the reliability of reinforcement-learned data. Further, the memory device 1 of the third embodiment can selectively execute a refresh write operation for the learned state S by referring to the flag cell. Thus, the memory device 1 of the third embodiment can omit an unnecessary refresh write operation, and can therefore shorten the processing time of the refresh operation.

[3-5] Modification of Third Embodiment

The memory device 1 of the third embodiment can be modified in various manners.

The role of the flag cell described in connection with the third embodiment may be assigned to a reference cell. In this case, the bit line BLy and the plurality of memory cells MC (flag cells) coupled to the bit line BLy are omitted from the memory cell array 10 illustrated in FIG. 22. Further, in the process of step ST53 of the memory completion operation, the control circuit 50 executes a third write operation in which a memory cell MC (reference cell) in the state S(k) in the memory group MG2 is targeted. In the process of step ST56, the control circuit 50 executes a second read (operation in which a plurality of memory cells MC in the memory group MG2 are targeted, and acquires a reference value RVinit from the read results. In the process of step ST60 of the deterioration confirmation operation, the control circuit 50 executes a second read operation in which the memory cells MC in the memory group MG2 are targeted, and acquires a reference value RVnow from the read results.

If, in the memory operation, information on the learning-completed state S is stored in the memory unit 57, the control circuit 50 may omit the process of step ST51 from the memory completion operation described with reference to FIG. 25. In this case, in the process of step ST52, the control circuit 50 merely confirms whether or not learning for the target state S is completed. In this case, for example, the third write operation in step ST53 is executed for the flag cell in the learning-completed state S, and the third write operation for the flag cell in the learning-incomplete state S is omitted.

Where a third write operation is appropriately executed for the flag cell in the refresh write operation described with reference to FIG. 27, it can be presumed that the reference value RV obtained by the second read operation performed for the plurality of flag cells of the memory group MG3 becomes closer to the reference value RVinit recorded in the memory completion operation. In the refresh operation, therefore, the processes of steps ST78 and ST79 may be omitted. In this case, the reference value RVinit maintains the value recorded in the memory completion operation even after the refresh operation.

Further, if the processes of steps ST78 and ST79 are omitted, the refresh operation time is shortened.

[4] Fourth Embodiment

The memory device 1 according to the fourth embodiment guarantees data stored in the memory group MG1 after the memory operation is completed, by using a method different from that of the third embodiment.

A description will be given of the points in which the memory device 1 of the fourth embodiment differs from those of the first to third embodiments.

[4-1] Configuration of Memory Cell Array 10

Figure 29:
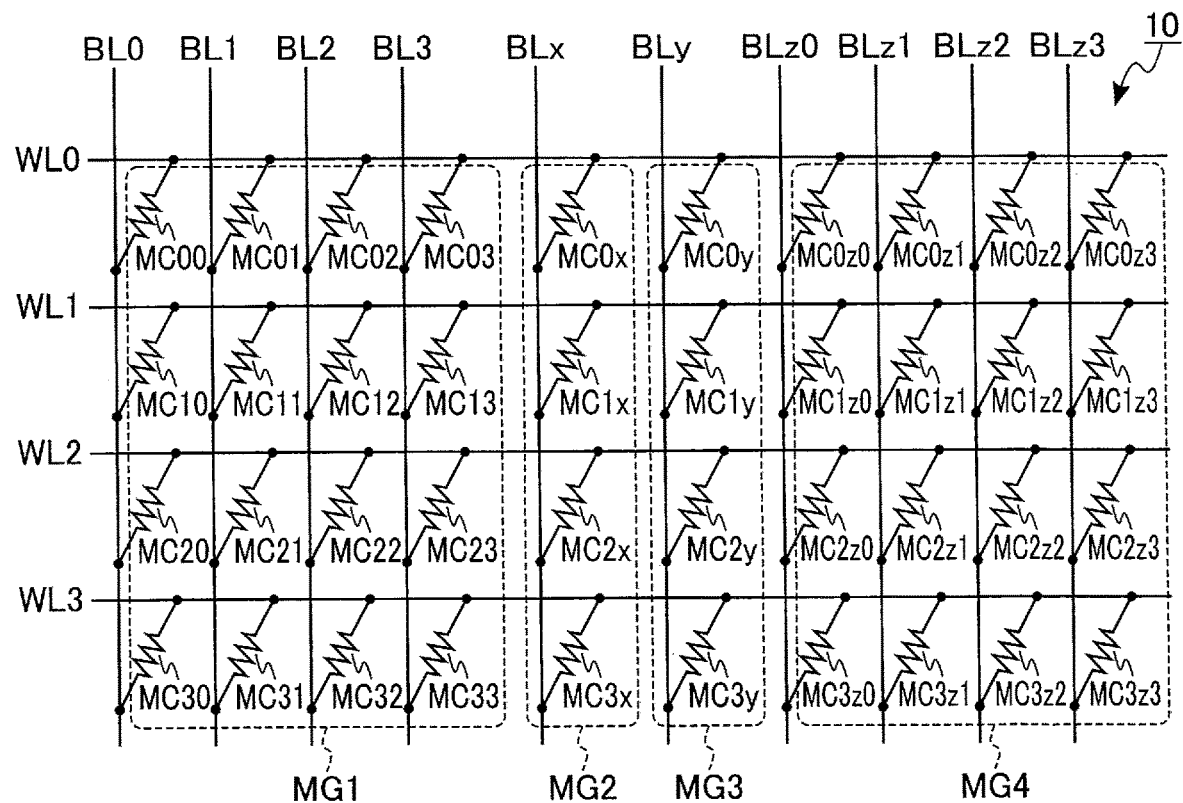
FIG. 29 is a circuit diagram illustrating an example of a circuit configuration of a memory cell array provided in a memory device according to the fourth embodiment.

FIG. 29 is a circuit diagram illustrating an example of a circuit configuration of the memory cell array 10 provided in the memory device 1 of the fourth embodiment. As illustrated in FIG. 29, the memory cell array 10 of the fourth embodiment is similar to the memory cell array 10 described in connection with the third embodiment with reference to FIG. 22, except that memory cells MC0z0 to MC0z3, MC1z0 to MC1z3, MC2z0 to MC2z3 and MC3z0 to MC3z3 and bit lines BLz0 to BLz3 are added.

Specifically, the memory cells MC0z0 to MC0z3 are coupled between the word line WL0 and the bit lines BLz0 to BLz3, respectively. The memory cells MC1z0 to MC1z3 are coupled between the word line WL1 and the bit lines BLz0 to BLz3, respectively. The memory cells MC2z0 to MC2z3 are coupled between the word line WL2 and the bit lines BLz0 to BLz3, respectively. The memory cells MC3z0 to MC3z3 are coupled between the word line WL3 and the bit lines BLz0 to BLz3, respectively.

In the memory device 1 of the fourth embodiment, the plurality of memory cells MC are classified into four memory groups MG. A memory group MG1 includes memory cells MC coupled to one of the bit lines BL0 to BL3. A memory group MG2 includes memory cells MC coupled to the bit line BLx. A memory group MG3 includes memory cells MC coupled to the bit line BLy. A memory group MG4 includes memory cells MC coupled to one of the bit lines BLz0 to BLz3. The roles of the memory groups MG1, MG2 and MG3 are similar to those in the third embodiment.

In the memory device 1 of the fourth embodiment, the memory group MG4 is used as a memory area for saving data stored in the memory group MG1. Therefore, for example, the number of memory cells MC included in the memory group MG1 and the number of memory cells MC included in the memory group MG4 are substantially equal. Each memory cell MC included in the memory group MG4 is associated with one of a plurality of memory cells MC used for reinforcement learning in the memory group MG1.

Specifically, the memory cells MC0z0 to MC0z3 are associated with the memory cells MC00 to MC03, respectively. The memory cells MC1z0 to MC1z3 are associated with the memory cells MC10 to MC13, respectively. The memory cells MC2z0 to MC2z3 are associated with the memory cells MC20 to MC23, respectively. The memory cells MC3z0 to MC3z3 are associated with the memory cells MC30 to MC33, respectively. Other configurations of the memory device 1 of the fourth embodiment are similar to those of the third embodiment.

[4-2] Memory Completion Operation

Figure 30:
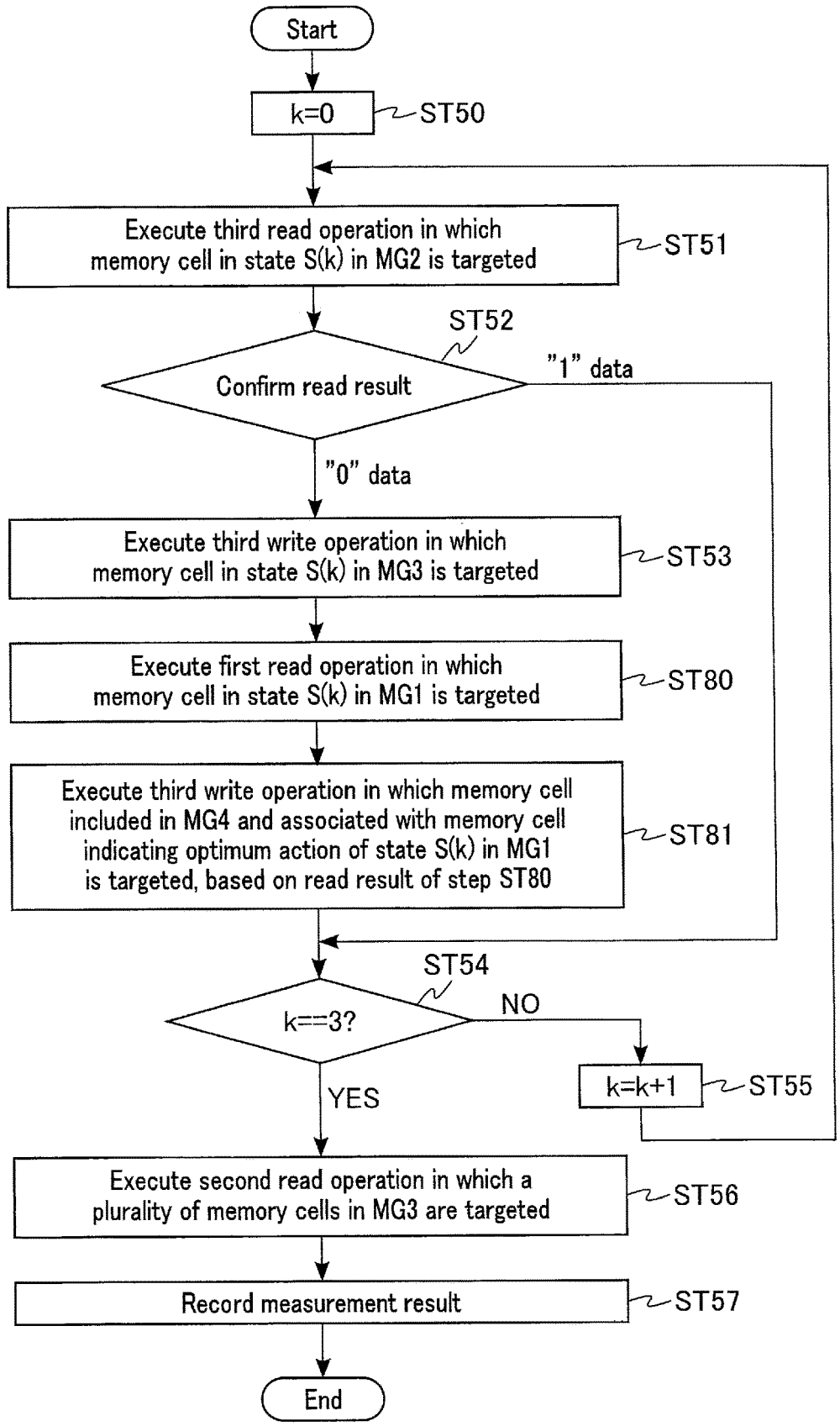
FIG. 30 is a flowchart illustrating an example of how a memory completion operation is performed in the memory device of the fourth embodiment.

FIG. 30 is a flowchart illustrating an example of how a memory completion operation is performed, in the memory device 1 of the fourth embodiment. As illustrated in FIG. 30, the memory completion operation of the memory device 1 of the fourth embodiment is similar to the memory completion operation described in connection with the third embodiment with reference to FIG. 25, except that the processes of steps ST80 and ST81 are added. Steps ST80 and ST81 are inserted between steps S53 and ST54.

Specifically, when the process of step ST53 is completed, the control circuit 50 proceeds to the process of step ST80. In the process of step ST80, the control circuit 50 executes a first read operation in which the memory cell MC in the state S(k) in the memory group MG1 is targeted. By this first read operation, the control circuit 50 confirms a memory cell MC indicating an optimum action in the state S(k), that is, a memory cell MC having the lowest resistance value in the memory group MG1.

When the process of step ST80 is completed, the control circuit 50 proceeds to the process of step ST81. In the process of step ST81, the control circuit 50 executes a third write operation in which the memory cell MC included in the memory group MG4 and associated with the memory cell MC indicating an optimum action of the state S(k) in the memory group MG1 is targeted, based on the read result of step ST80. As a result, the resistance value of the memory cell MC associated with the optimum action in the memory group MG4 is lowered.

When the process of step ST81 is completed, the control circuit 50 proceeds to the process of step ST54. Other operations of the memory completion operation of the fourth embodiment are similar to those of the memory completion operation of the third embodiment.

By the memory completion operation described above, the memory device 1 can reflect (copy) the mapping of memory cells MC of optimum actions of the memory group MG1 in (to) the memory group MG4. Thus, the control circuit 50 can grasp an address of a memory cell MC of the optimum action by searching for a memory cell MC having the lowest resistance value in the memory group MG4. The memory completion operation in the fourth embodiment may be referred to as a "mapping operation" or a "cell address mapping operation".

[4-3] Refresh Operation

FIG. 31 is a flowchart illustrating an example of how a refresh operation is performed in the memory device 1 of the fourth embodiment. As illustrated in FIG. 31, the refresh operation of the memory device 1 of the fourth embodiment is similar to the refresh operation described in connection with the third embodiment with reference to FIG. 27, except that step ST73 is replaced with step ST90.

In the process of step ST90, the control circuit 50 executes a first read operation in which a plurality of memory cells MC in the state S(k) in the memory group MG4 are targeted. Since the memory group MG4 stores data copied from the memory group MG1, the control circuit 50 can identify a memory cell MC of an optimum action in the state S(k) from the result of the first read operation in step ST90. The control circuit 50 can execute a refresh write operation or the like in which the memory cell MC of the memory group MG1 is targeted, as in the third embodiment. In other words, the control circuit 50 can execute a refresh write operation in which only the learned state S (word line WL) is targeted, by referring to the flag cell. Other operations of the memory device 1 of the fourth embodiment are similar to those of the third embodiment.

[4-3] Advantages of Fourth Embodiment

The memory device 1 of the fourth embodiment includes an area (memory group MG4) used for the refresh operation. The memory group MG4 is used as a mirror area in which the data copied from the memory group MG1 is stored. As the write operation executed for the memory group MG4, a third write operation including a verify operation is used.

Therefore, the retention performance of the memory cell MC of the memory group MG4 is higher than that of the memory cell MC of the memory group MG1. The memory device 1 can grasp the address of the memory cell MC of the optimum action in each state S by executing the first read operation for the memory group MG4 in the refresh operation.

As a result, the memory device 1 of the fourth embodiment can refresh the data of the memory group MG1 by using data of the memory group MG4 which is more reliable than data of the memory group MG1. Therefore, the memory device 1 of the fourth embodiment can improve the reliability of data more than that of the third embodiment.

[4-4] Modification of Fourth Embodiment

The memory device 1 of the fourth embodiment can be modified in various manners. For example, although reference was made to the case where the size of the memory group MG4 is the same as that of the memory group MG1, this is not restrictive.

For example, the memory group MG4 may store only the address information on the memory cell MC of the optimum action. In this case, when the learning result stored in the memory group MG1 is written to the memory group MG4, the control circuit 50 causes the address of the memory cell MC of the optimum action to be stored in a plurality of memory cells MC in the memory group MG4 for each state S. Even in such a case, the memory device 1 can execute a refresh operation similar to that of the fourth embodiment, and can obtain advantages similar to those of the fourth embodiment. Further, in this modification, the memory capacity of the memory group MG4 can be made smaller than that of the memory group MG1, so that the area of the memory cell array 10 can be reduced.

The user may use the data stored in the memory group MG4 as a learning result. In this case, the memory cell MC of the memory group MG1 is used only at the time of learning. The memory device 1 can store the learning result in a memory cell MC that is less affected by the disturbance, by finally writing the learning result to the memory group MG4. Further, the memory device 1 can use the learning result in a state where the margin of the on/off ratio is large, by using the third write operation for writing the learning result to the memory group MG4.

[5] Others

The memory device 1 described in each embodiment can be used as a chip which executes a specific operation for a long period of time using a memory result (learning model) obtained after one memory operation (reinforcement learning) is executed. In other words, the memory device 1 can be used as a system which performs learning (memory operation) necessary for a required operation once, and which, after the learning is completed, repeatedly executes a specific control for a certain period of time using the model. Specifically, the memory device 1 can be used for robot arm control, games, etc. In this case, the pair consisting of a word line WL and a bit line BL, which is set by the memory completion operation, is not updated regardless of a time or input data, and is therefore invariant.

Each of the embodiments described above can be modified in various manners.

Details of the operations described in connection with the above embodiments can be appropriately changed, depending on the type of the resistance changing element used as a memory cell MC. For example, in connection with the above embodiments, reference was made to the case where the memory cell MC is an FTJ element and the control circuit 50 selects a bit line BL having the largest read current in a first read operation (for example, the action A(i) in step ST12), but this case is not restrictive. The control circuit 50 may select a bit line BL, based on the magnitudes of read currents of a plurality of bit lines BL acquired in the first read operation. In other words, the control circuit 50 may select the bit line BL at least according to the difference in the read currents acquired in the first read operation. For example, the control circuit 50 may select which bit line BL has the lowest read current from among the plurality of bit lines BL in the first read operation.

A semiconductor memory element such as a flash memory, a hard disk, an optical disk or the like may be used as part of the memory circuit used by the control circuit 50. The memory circuit may be a memory medium in which a program transmitted by a LAN (Local Area Network), the Internet or the like is downloaded and stored or temporarily stored. Further, the memory medium used by the memory circuit is not limited to one, and a plurality of memory media may be used.

A general-purpose processor such as an MPU (Micro Processing Unit) or a GPU (Graphical Processing Unit) may be used in place of the CPU of the control circuit 50. Each of the processes described in connection with each embodiment may be implemented by dedicated hardware. For example, the control circuit 50 may be an ASIC (Application Specific Integrated Circuit), or a programmable logic device (for example, SPLD (Simple Programmable Logic Device), CPLD (Complex Programmable Logic Device), FPGA (Field Programmable Gate Array), etc.). Each operation described in connection with each embodiment may be a combination of a process executed by software and a process executed by hardware, or may be only one of the processes.

In each embodiment, the flowcharts used to explain operations are merely examples. As long as the same result can be obtained, the processes of each operation may be interchanged in order, other processes may be added to the operation, or some processes may be omitted. For example, the processes of steps ST15 and ST16 illustrated in FIG. 13 may be inserted immediately after the process of step ST11. In this case, the second read operation of step ST15 and the action A(i) of step ST13 can be executed in parallel. In the memory process flow illustrated in FIG. 17, the process of step ST200 may be inserted in the first trial process. In this case, upon detection of the first condition being satisfied, the control circuit 50 immediately switches the flow of the penalty process to the second trial process. Similarly, in other operations, the timing of condition determination and the timing of switching processing can be changed as appropriate.

In this specification, the "word line WL" may be referred to as a lateral interconnect. The "bit line BL" may be referred to as a vertical interconnect. Each of the word line WL and the bit line BL may be simply referred to as an "interconnect". The threshold voltage of a memory cell MC indicates, for example, a voltage that exceeds a predetermined read current amount when a forward voltage is applied to the memory cell MC in a low resistance state. The term "coupling" means that elements are electrically coupled and another element may be interposed therebetween. The "one end of the memory cell MC" corresponds to, for example, the upper electrode (conductor layer 11) of the memory cell MC. The "other end of the memory cell MC" corresponds to, for example, the lower electrode (conductor layer 12) of the memory cell MC. The state where a voltage is applied to an interconnect by the first driver circuit 20 or the second driver circuit 30 may be expressed as "the control circuit 50 applies the voltage to the interconnect", and the operations may be described as being executed mainly by the control circuit 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a plurality of first interconnects;
a plurality of second interconnects each intersecting the first interconnects;
a plurality of first memory cells respectively provided at a plurality of intersections between the first interconnects and the second interconnects,
each of the first memory cells being coupled to one first interconnect of the first interconnects and one second interconnect of the second interconnects; and
a control circuit configured to:
acquire information on a state of a control target;
cause the control target to execute an action based on the state; and
execute a read operation and a write operation, based on the state, wherein
the control circuit is configured to execute a plurality of trial processes each including a first operation, a second operation and a third operation,
in the first operation, the control circuit executes a first read operation for a plurality of first memory cells coupled between a first interconnect selected from the first interconnects, based on the control target being in a first state, and the second interconnects, and selects a second interconnect, based on magnitudes of read currents of the second interconnects acquired by the first read operation,
in the second operation, the control circuit causes the control target to execute an action associated with the selected second interconnect, and the control target transitions to a second state after executing the action associated with the selected second interconnect,
in the third operation, the control circuit executes a first process or a second process in which the selected first interconnect is targeted, based on the control target being in the second state,
in the first process, the control circuit applies a write voltage of a first direction to a first memory cell coupled to the selected first interconnect and the selected second interconnect, and applies a write voltage of a second direction different from the first direction to a first memory cell coupled to the selected first interconnect and a non-selected second interconnect,
in second processes of first to m-th trial processes (m is an integer of 2 or more), the control circuit applies the write voltage of the second direction to the first memory cell coupled to the selected first interconnect and the selected second interconnect, and omits a write operation in which the first memory cell coupled to the selected first interconnect and the non-selected second interconnect is targeted, and
in second processes of (m+1)th and subsequent trial processes, the control circuit applies the write voltage of the second direction to the first memory cell coupled to the selected first interconnect and the selected second interconnect, and applies the write voltage of the first direction to the first memory cell coupled to the selected first interconnect and the non-selected second interconnect.

2. The device of claim 1, further comprising:
a third interconnect that intersects the first interconnects;
a plurality of second memory cells respectively provided at a plurality of intersections between the first interconnects and the third interconnect, each of the second memory cells being coupled to one first interconnect of the first interconnects and the third interconnect; and
a memory circuit configured to store information on the trial processes, wherein
each of the trial processes includes a second read operation in which the second memory cells are targeted, and
the control circuit causes the memory circuit to store a sum of read currents of the second memory cells acquired by the second read operation as a first reference value.

3. The device of claim 2, wherein
in the trial processes, where the control circuit detects that a first reference value acquired by an n-th trial process (n is an integer of 2 or more) is lower than a first reference value acquired by an (n−1)th trial process, the second processes of the (m+1)th and subsequent trial processes are executed in the second processes of (n+1)th and subsequent trial processes.

4. The device of claim 1, wherein
in the first read operation, the control circuit is configured to:
apply a first voltage to the selected first interconnect;
apply a second voltage lower than the first voltage to a non-selected first interconnect; and
apply the second voltage to the second interconnects.

5. The device of claim 2, wherein
in the second read operation, the control circuit is configured to:
apply a third voltage to the first interconnects; and
apply a fourth voltage lower than the third voltage to the third interconnect.

6. The device of claim 1, wherein
where a write voltage of the first direction is applied to the first memory cell coupled to the selected first interconnect and the selected second interconnect, the control circuit is configured to:
apply a fifth voltage to the selected first interconnect;
apply a sixth voltage lower than the fifth voltage to the selected second interconnect; and
apply a seventh voltage intermediate between the fifth voltage and the sixth voltage to each of a non-selected first interconnect and the non-selected second interconnect, and
where the write voltage of the second direction is applied to the first memory cell coupled to the selected first interconnect and the selected second interconnect, the control circuit is configured to:
apply an eighth voltage to the selected first interconnect;
apply a ninth voltage higher than the eighth voltage to the selected second interconnect; and
apply a tenth voltage intermediate between the eighth voltage and the ninth voltage to each of the non-selected first interconnect and the non-selected second interconnect.

7. The device of claim 1, further comprising:
a third interconnect intersecting the first interconnects;
a plurality of second memory cells respectively provided at a plurality of intersections between the first interconnects and the third interconnect, each of the second memory cells being coupled to one first interconnect of the first interconnects and the third interconnect; and
a memory circuit configured to store information on the trial processes, wherein
each of the trial processes includes a third read operation in which a second memory cell coupled to the selected first interconnect is targeted, and the control circuit causes the memory circuit to store a read current value of the second memory cell acquired by the third read operation as a second reference value for each first interconnect.

8. The device of claim 7, wherein
in a trial process in which the second reference value associated with the selected first interconnect decreases two or more times in a row, the control circuit omits the first process and the second process.

9. The device of claim 1, further comprising:
a fourth interconnect intersecting the first interconnects; and
a plurality of third memory cells respectively provided at a plurality of intersections between the first interconnects and the fourth interconnect, each of the third memory cells being coupled to one first interconnect of the first interconnects and the fourth interconnect, wherein
after the trial processes are completed and where one first interconnect and one second interconnect are associated with each other, the control circuit executes a write operation including a verify operation, to a third memory cell coupled to the one first interconnect being targeted.

10. The device of claim 9, further comprising:
a memory circuit configured to store information on the trial processes, wherein
after the trial processes, the control circuit executes a fourth read operation in which the third memory cells are targeted, and causes the memory circuit to store a sum of read currents of the third memory cells acquired by the fourth read operation as a third reference value.

11. The device of claim 10, wherein
after the trial processes are completed, the control circuit is configured to:
accumulate the third reference value in the memory circuit by periodically executing the fourth read operation in which the third memory cells are targeted; and
execute a refresh operation, based on a change in the third reference value, the refresh operation including a write operation that lowers a resistance value of a first memory cell which is included among the first memory cells sharing a first interconnect and which has a smallest resistance value.

12. The device of claim 11, wherein
the control circuit executes the refresh operation where a third reference value acquired at a k-th time (k is an integer of 2 or more) after the trial processes are completed is less than 50% of a third reference value that is first acquired after the trial processes.

13. The device of claim 1, further comprising:
a plurality of fifth interconnects intersecting the first interconnects, the fifth interconnects being equal in number to the second interconnects; and
a plurality of fifth memory cells respectively provided at a plurality of intersections between the first interconnects and the fifth interconnects, each of the fifth memory cells being coupled to one first interconnect of the first interconnect and one fifth interconnect of the fifth interconnects, the fifth memory cells being associated with the first memory cells, respectively, wherein
the control circuit is configured to:
execute a write operation including a verify operation, to a fifth memory cell associated with a first memory cell having a smallest resistance value being targeted, in each of sets of the first memory cells and the fifth memory cells sharing the first interconnect; and execute a refresh operation based on a result of a read operation in which the fifth memory cells are targeted, the refresh operation including a write operation of lowering the resistance value of a first memory cell which is included among the first memory cells sharing the first interconnect and which has a smallest resistance value.

14. The device of claim 1, further comprising:
a plurality of sixth interconnects that intersect the first interconnects; and
a plurality of sixth memory cells respectively provided at a plurality of intersections between the first interconnects and the sixth interconnects, each of the sixth memory cells being coupled to one first interconnect of the first interconnects and one sixth interconnect of the sixth interconnects, wherein
after the trial processes are completed, the control circuit is configured to:
cause the sixth memory cells sharing the first interconnect to store address information on a first memory cell having a smallest resistance value, in each of sets of the first memory cells and the sixth memory cells sharing the first interconnect;
execute a refresh operation, based on the address information stored in the sixth memory cells, the refresh operation including a write operation of lowering the resistance value of a first memory cell which is included among the first memory cells sharing the first interconnect and has a smallest resistance value.

15. The device of any one of claim 1, wherein
the first memory cell includes a ferroelectric film and a paraelectric film, and the ferroelectric film and the paraelectric film are provided between the first interconnect and the second interconnect.

16. A memory method for a memory device including a plurality of first interconnects, a plurality of second interconnects and a plurality of first memory cells, each of the second interconnects intersecting the first interconnects, the first memory cells being respectively provided at a plurality of intersections between the first interconnects and the second interconnects, each of the first memory cells being coupled to one first interconnect of the first interconnect and one second interconnect of the second interconnects, the memory method comprising:
executing a plurality of trial processes each including a first operation, a second operation and a third operation, wherein
the first operation includes executing a first read operation for a plurality of first memory cells coupled between a first interconnect selected from the first interconnects, based on a control target being in a first state, and the second interconnects, and selecting a second interconnect, based on magnitudes of read currents of the second interconnects acquired by the first read operation,
the second operation includes causing the control target to execute an action associated with the selected second interconnect,
the third operation includes executing a first process or a second process in which the selected first interconnect is targeted, based on the control target being in a second state,
the first process includes applying a write voltage of a first direction to a first memory cell coupled to the selected first interconnect and the selected second interconnect, and applying a write voltage of a second direction different from the first direction to a first memory cell coupled to the selected first interconnect and a non-selected second interconnect, second processes of first to m-th trial processes (m is an integer of 2 or more) include applying the write voltage of the second direction to the first memory cell coupled to the selected first interconnect and the selected second interconnect, and omitting a write operation in which the first memory cell coupled to the selected first interconnect and the non-selected second interconnect is targeted, and second processes of (m+1)th and subsequent trial processes include applying the write voltage of the second direction to the first memory cell coupled to the selected first interconnect and the selected second interconnect, and applying the write voltage of the first direction to the first memory cell coupled to the selected first interconnect and the non-selected second interconnect.

17. The method of claim 16, wherein
the memory device further includes a third interconnect, a plurality of second memory cells and a memory circuit, the third interconnect intersecting the first interconnects, the second memory cells being respectively provided at a plurality of intersections between the first interconnects and the third interconnect, each of the second memory cells being coupled to one first interconnect of the first interconnects and the third interconnect, each of the trial processes includes a second read operation in which the second memory cells are targeted, the second read operation includes acquiring read current values of the second memory cells and storing a sum of the read current values in the memory circuit as a first reference value, and where, in the trial processes, a first reference value acquired by an n-th trial process (n is an integer of 2 or more) is detected as being lower than a first reference value acquired by an (n−1)th trial process, the second processes of the (m+1)th and subsequent trial processes are executed in the second processes of (n+1)th and subsequent trial processes.

18. The method of claim 16, wherein
the memory device further includes a third interconnect, a plurality of third memory cells and a memory circuit, the third interconnect intersecting the first interconnects, the third memory cells are respectively provided at a plurality of intersections between the first interconnects and the third interconnect, each of the third memory cells is coupled to one first interconnect of the first interconnects and the third interconnect, each of the trial processes includes a third read operation in which a third memory cell coupled to the selected first interconnect is targeted, the third read operation includes acquiring a read current value of the third memory cell and storing the acquired read current value of the third memory cell in the memory circuit as a second reference value associated with the selected first interconnect, and in a trial process in which the second reference value associated with the selected first interconnect decreases two or more times in a row, the first process and the second process are omitted.

19. The method of claim 16, wherein
the memory device further includes a fourth interconnect, a plurality of fourth memory cells and a memory circuit, the fourth interconnect intersects the first interconnects, the fourth memory cells are respectively provided at a plurality of intersections between the first interconnects and the fourth interconnect, each of the fourth memory cells is coupled to one first interconnect of the first interconnects and the fourth interconnect, the method further comprising:

periodically executing a fourth read operation in which the fourth memory cells are targeted, after the trial processes, and executing a refresh operation based on a change in a third reference value, wherein the fourth read operation includes acquiring read current values of the fourth memory cells, and storing a sum of the acquired read current values of the fourth memory cells in the memory circuit as the third reference value, and the refresh operation includes a write operation that lowers a resistance value of a first memory cell which is included among the first memory cells sharing a first interconnect and which has a smallest resistance value.

20. The method of claim 19, wherein
the refresh operation is executed where a third reference value acquired at a k-th time (k is an integer of 2 or more) after the trial processes are completed is less than 50% of a third reference value that is first acquired after the trial processes.

* * * * *